(12) United States Patent
Parekh

(10) Patent No.: US 10,756,111 B2
(45) Date of Patent: Aug. 25, 2020

(54) INTEGRATED ASSEMBLIES HAVING THICKER SEMICONDUCTOR MATERIAL ALONG ONE REGION OF A CONDUCTIVE STRUCTURE THAN ALONG ANOTHER REGION, AND METHODS OF FORMING INTEGRATED ASSEMBLIES

(71) Applicant: Micron Technology, Inc., Boise, ID (US)

(72) Inventor: Kunal R. Parekh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/439,278

(22) Filed: Jun. 12, 2019

(65) Prior Publication Data

US 2020/0013798 A1 Jan. 9, 2020

Related U.S. Application Data

(63) Continuation of application No. 16/029,144, filed on Jul. 6, 2018, now Pat. No. 10,446,577.

(51) Int. Cl.
*H01L 27/11582* (2017.01)
*H01L 27/11556* (2017.01)
*H01L 29/06* (2006.01)
*H01L 21/02* (2006.01)
(Continued)

(52) U.S. Cl.
CPC .... *H01L 27/11582* (2013.01); *H01L 21/0217* (2013.01); *H01L 21/02164* (2013.01); *H01L 21/76224* (2013.01); *H01L 21/76877* (2013.01); *H01L 27/11556* (2013.01); *H01L 29/0649* (2013.01)

(58) Field of Classification Search
CPC ......... H01L 27/11582; H01L 27/11556; H01L 27/11524; H01L 27/1157; H01L 27/11529; H01L 27/11521; H01L 27/11568; H01L 27/11514; H01L 27/11551; H01L 21/76224; H01L 21/02164; H01L 21/0217; H01L 21/76877; H01L 21/8229; H01L 21/8239; H01L 29/0649; H01L 2924/1438
See application file for complete search history.

(56) References Cited

U.S. PATENT DOCUMENTS

| | | | | |
|---|---|---|---|---|
| 9,230,974 | B1 * | 1/2016 | Pachamuthu | ....... H01L 27/1157 |
| 9,876,031 | B1 * | 1/2018 | Shimizu | ............ H01L 27/11582 |
| 10,446,566 | B2 * | 10/2019 | Parekh | .............. H01L 27/11519 |

(Continued)

*Primary Examiner* — Galina G Yushina
(74) *Attorney, Agent, or Firm* — Wells St. John P.S.

(57) ABSTRACT

Some embodiments include an integrated assembly having a conductive structure which includes a semiconductor material over a metal-containing material. A stack of alternating conductive levels and insulative levels is over the conductive structure. A partition extends through the stack. The partition has wall regions, and has corner regions where two or more wall regions meet. The conductive structure includes a first portion which extends directly under the corner regions, and includes a second portion which is directly under the wall regions and is not directly under the corner regions. The first portion has a first thickness of the semiconductor material and the second portion has a second thickness of the semiconductor material. The first thickness is greater than the second thickness. Some embodiments include methods of forming integrated assemblies.

12 Claims, 39 Drawing Sheets

(51) Int. Cl.
*H01L 21/768* (2006.01)
*H01L 21/762* (2006.01)

(56) References Cited

U.S. PATENT DOCUMENTS

2017/0148808 A1* 5/2017 Nishikawa ............ H01L 23/528
2019/0006381 A1* 1/2019 Nakatsuji .......... H01L 27/11575
2019/0189629 A1* 6/2019 Parekh ................ H01L 29/7883

* cited by examiner

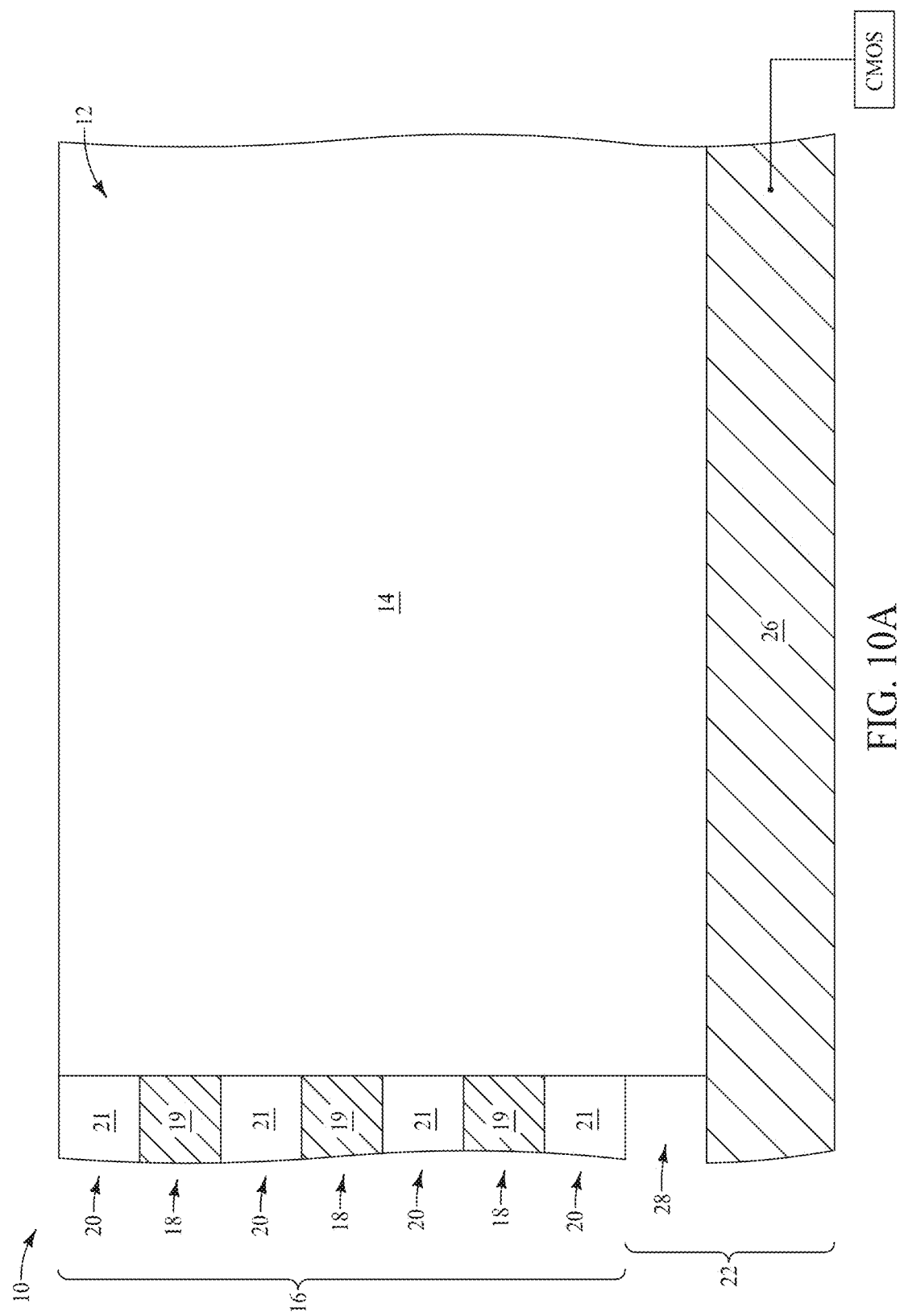

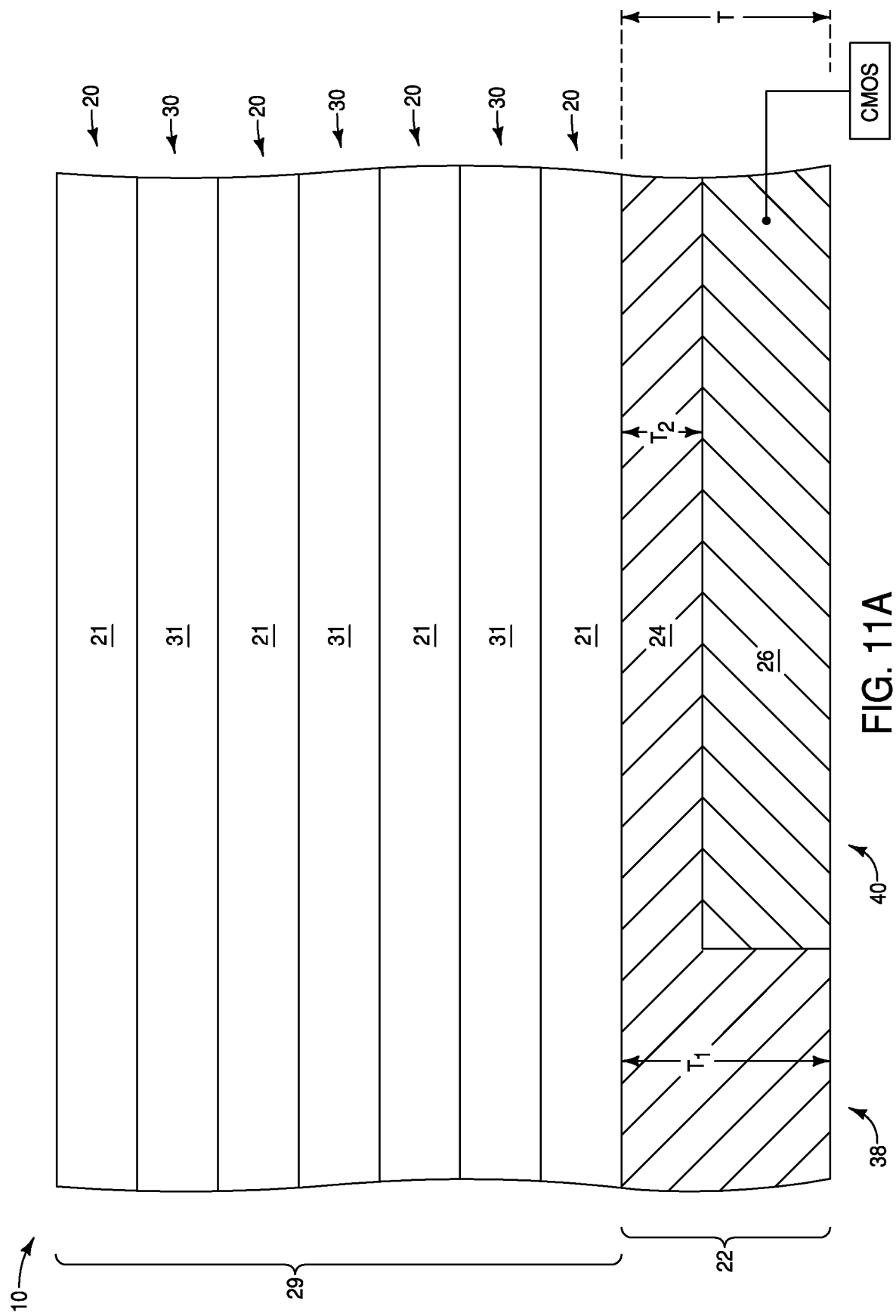

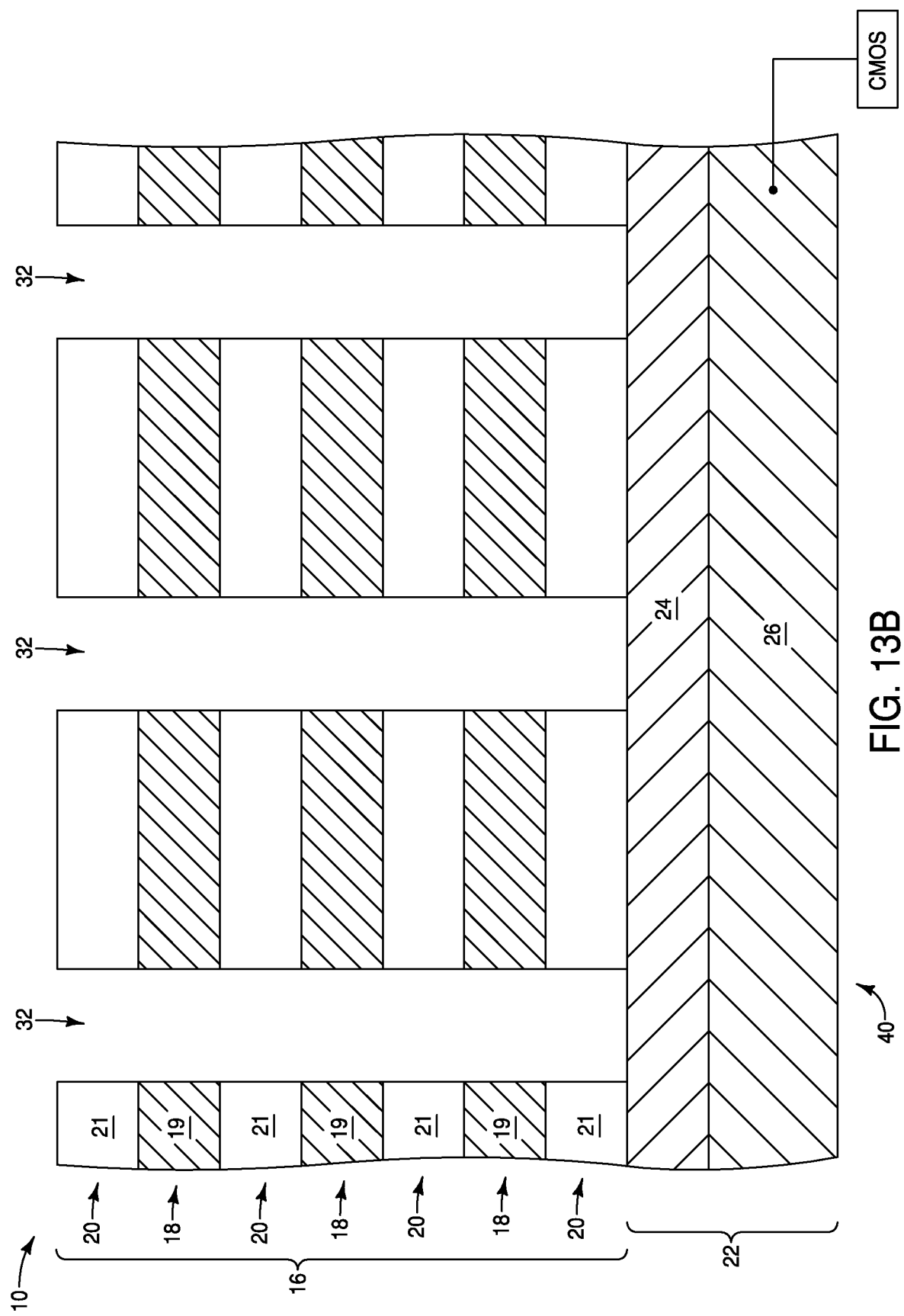

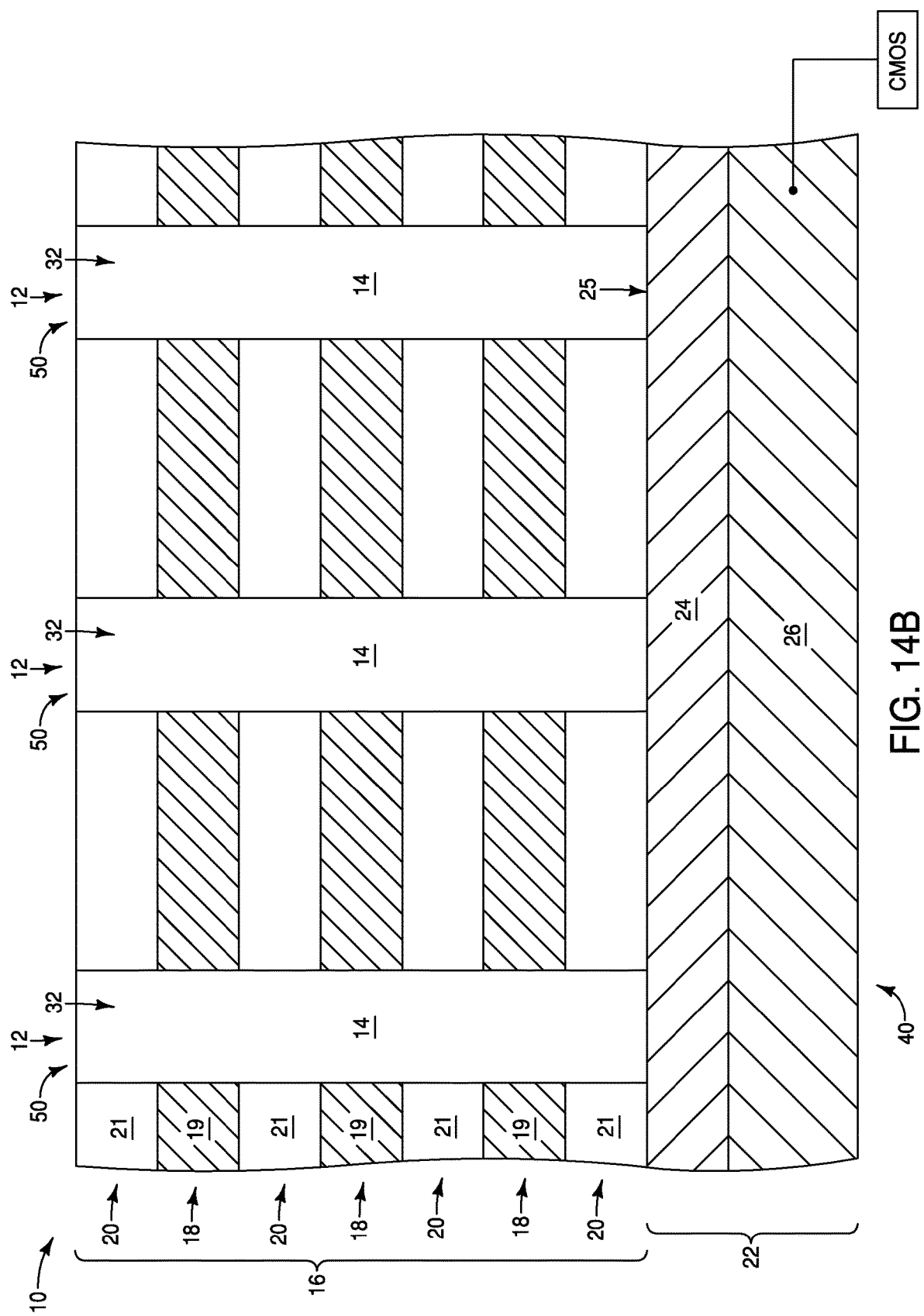

INTEGRATED ASSEMBLIES HAVING THICKER SEMICONDUCTOR MATERIAL ALONG ONE REGION OF A CONDUCTIVE STRUCTURE THAN ALONG ANOTHER REGION, AND METHODS OF FORMING INTEGRATED ASSEMBLIES

RELATED PATENT DATA

This patent resulted from a continuation of U.S. patent application Ser. No. 16/029,144, which was filed Jul. 6, 2018, and which is hereby incorporated herein by reference.

TECHNICAL FIELD

Integrated assemblies (e.g., three-dimensional NAND), and methods of forming integrated assemblies.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells.

Before describing NAND specifically, it may be helpful to more generally describe the relationship of a memory array within an integrated arrangement. FIG. 1 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals A0 through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. A memory control unit 1018 is used to control memory operations which are to be performed on the memory cells 1003, and utilizes signals on the control lines 1020. The device 1000 can receive supply voltage signals $V_{cc}$ and $V_{ss}$ on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the A0 through AX address signals on the address lines 1009. The select circuit 1040 can select the signals on the first data lines 1006 and the second data lines 1013 to provide communication between the memory array 1002 and the I/O circuit 1017 during read and programming operations.

The memory array 1002 of FIG. 1 may be a NAND memory array, and FIG. 2 shows a block diagram of a three-dimensional NAND memory device 200 which may be utilized for the memory array 1002 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as word-lines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_i$, tile column$_j$ and tile column$_k$, with each subset (e.g., tile column) comprising a "partial block" of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line) 350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 1.

A source of each source-select device 210 is connected to a common source line 216. The drain of each source-select device 210 is connected to the source of the first charge-storage transistor 208 of the corresponding NAND string 206. For example, the drain of source-select device $210_1$ is connected to the source of charge-storage transistor $208_1$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

It would be desirable to develop improved memory array architecture (e.g., improved NAND architecture), and to develop methods for fabricating the improved memory array architecture.

BRIEF DESCRIPTION OF THE DRAWINGS

FIGS. 7A-10A and 7B-10B are diagrammatic cross-sectional side views along the lines A-A and B-B, respectively, of prior art FIGS. 7-10.

FIGS. 11A-14A and 11B-14B are diagrammatic cross-sectional side views along the lines A-A and B-B, respectively, of FIGS. 11-14.

DETAILED DESCRIPTION OF THE ILLUSTRATED EMBODIMENTS

Some embodiments include recognition that a problem which may be encountered during fabrication of vertically-stacked memory (e.g., three-dimensional NAND) is unintended etching of supporting semiconductor material. Such may lead to problematic collapse of vertically-stacked structures, and may ultimately lead to device failure. Some embodiments include recognition that the problem may result from exposure of metal-containing conductive material under a region of the semiconductor material, followed by galvanic removal of the semiconductor material during subsequent processing. Some embodiments also include recognition that the problem may be alleviated by providing thickened regions of the semiconductor material at locations where etching would otherwise expose the underlying metal-containing conductive material. Example embodiments are described with reference to FIGS. 11-15.

Figure 1:
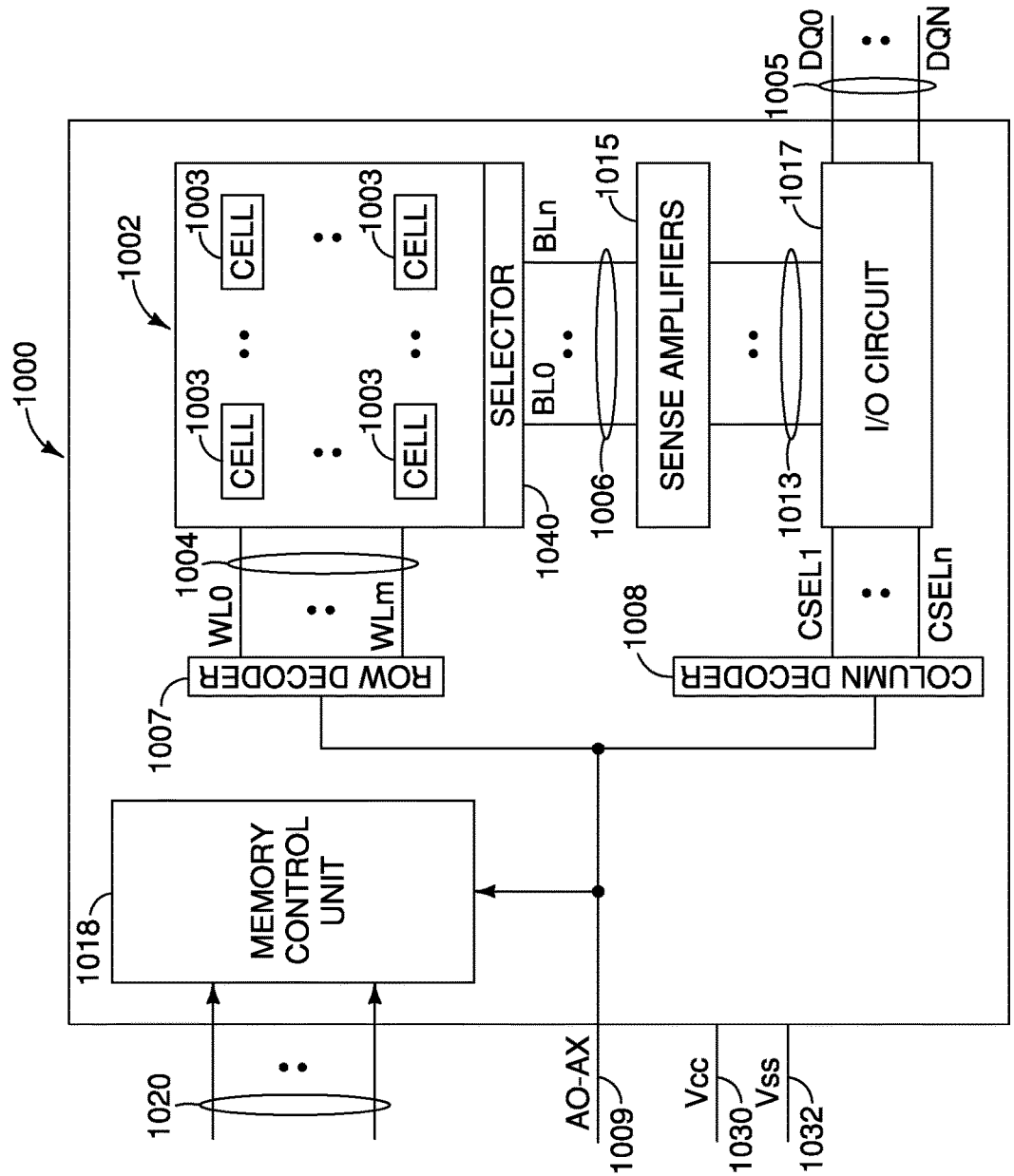
FIG. 1 shows a block diagram of a prior art memory device having a memory array with memory cells.
Figure 2:
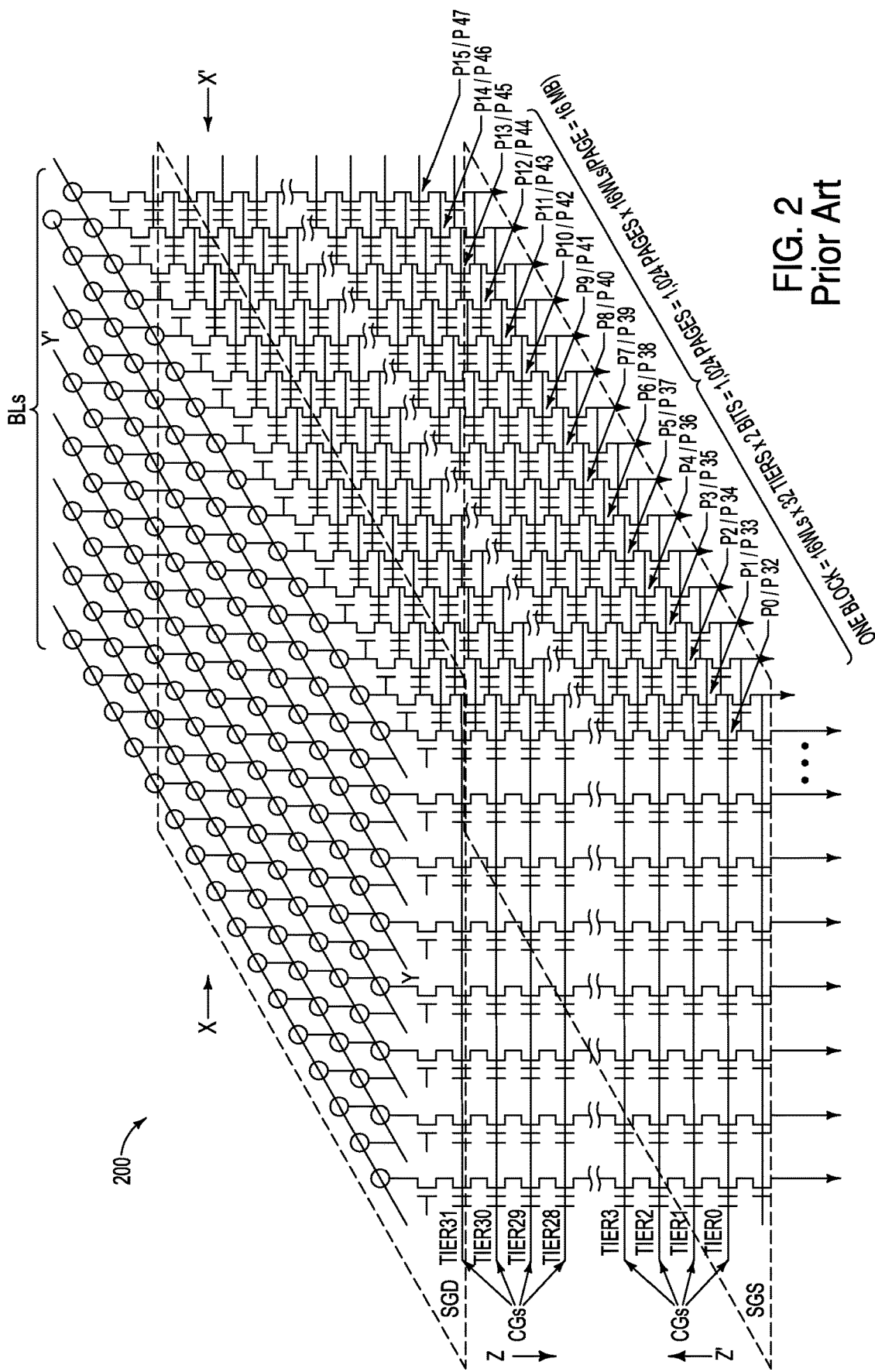
FIG. 2 shows a schematic diagram of the prior art memory array of FIG. 1 in the form of a 3D NAND memory device.
Figure 3:
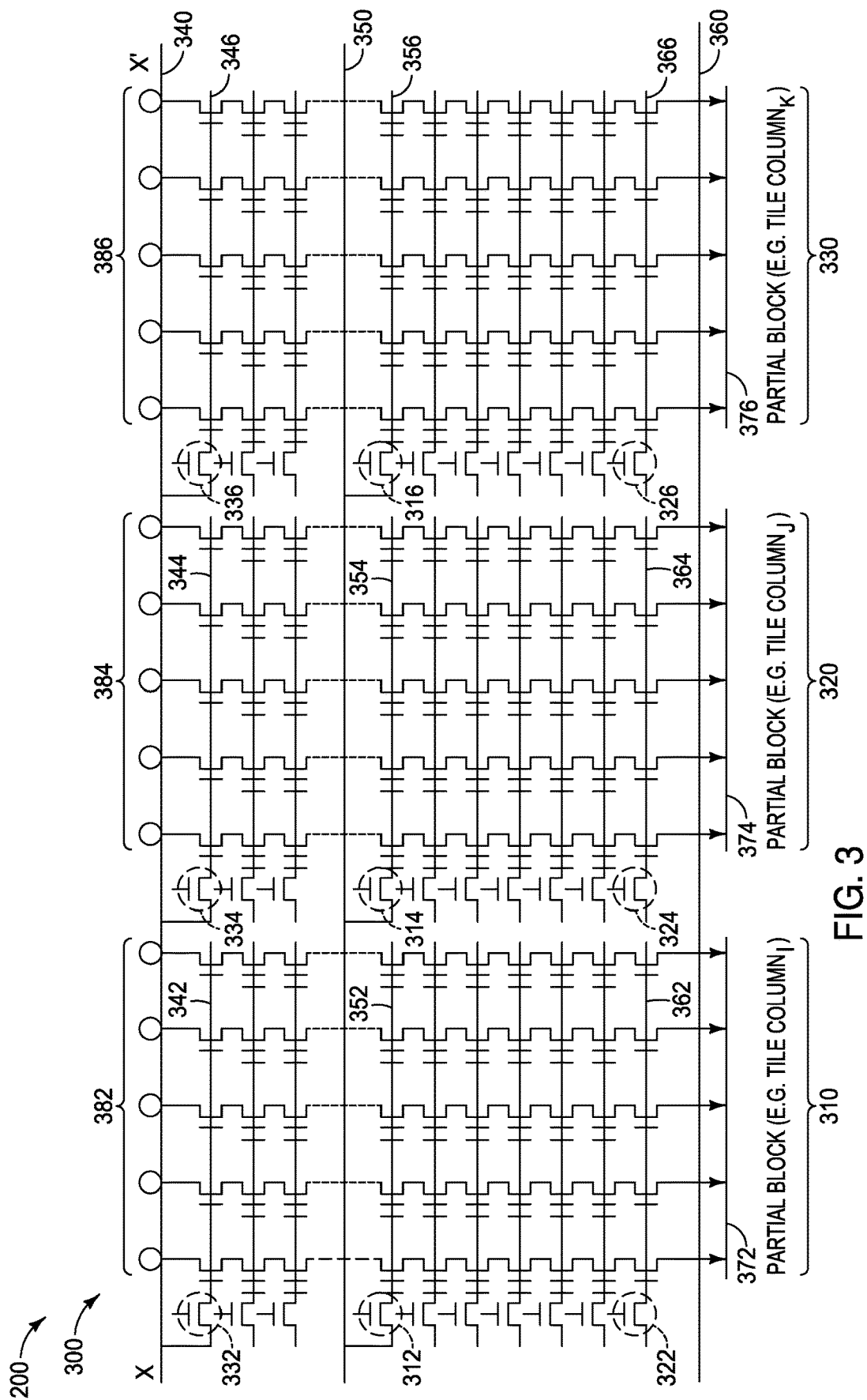
FIG. 3 shows a cross-sectional view of the prior art 3D NAND memory device of FIG. 2 in an X-X' direction.
Figure 4:
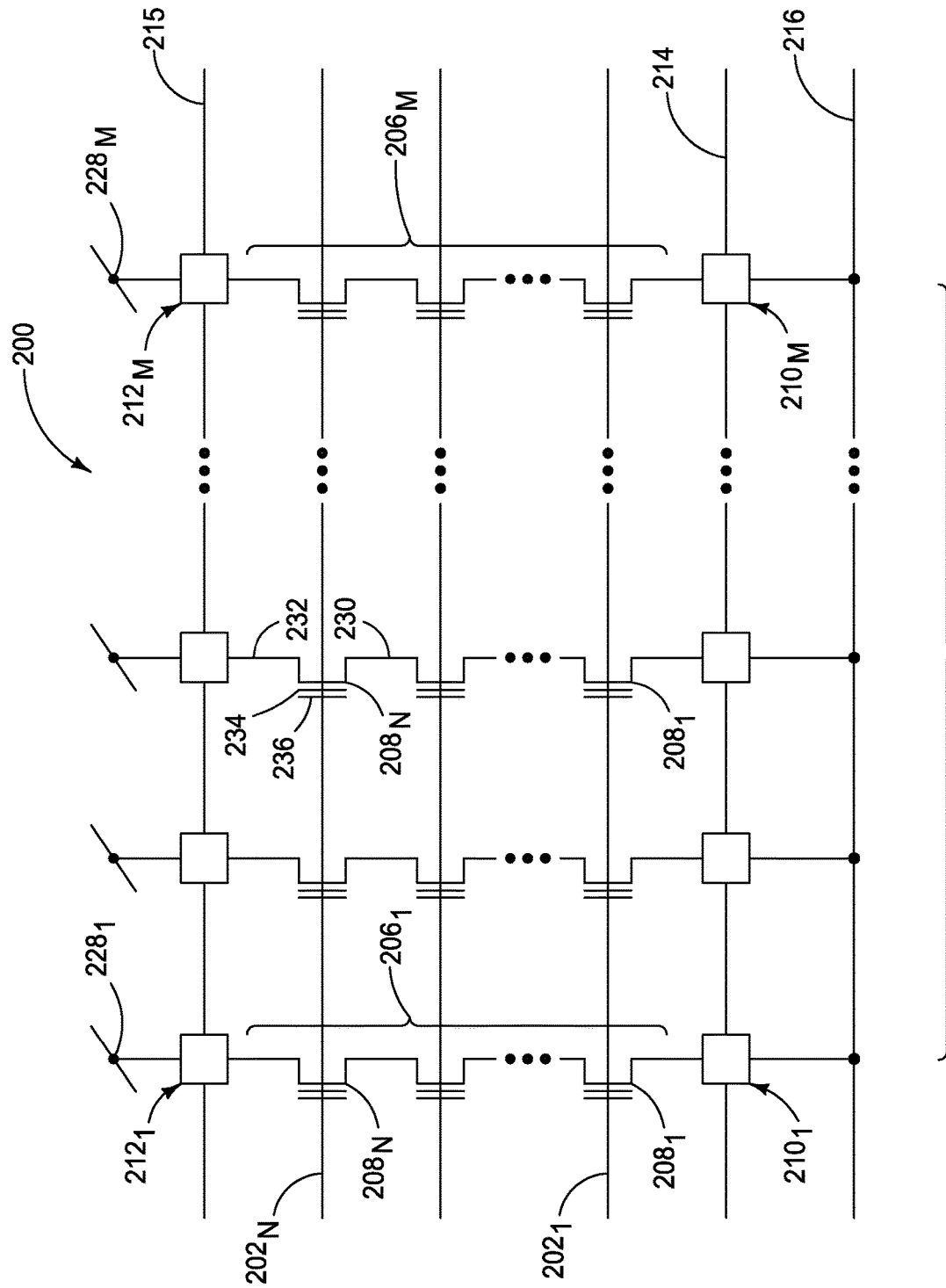
FIG. 4 is a schematic of a prior art NAND memory array.
Figure 5:
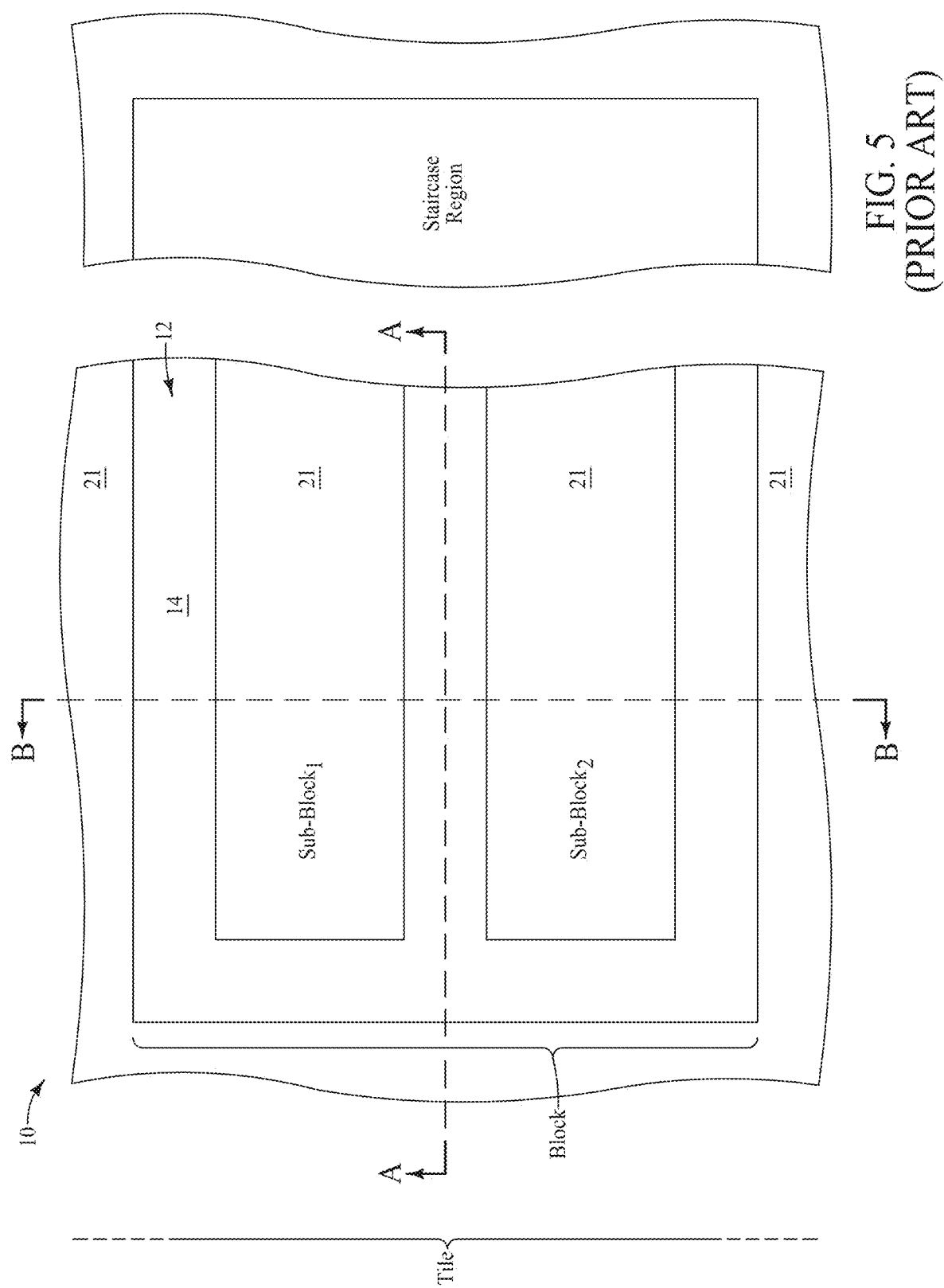
FIG. 5 is a diagrammatic top view of a region of a prior art integrated assembly illustrating an example architecture.
Figure 5A:
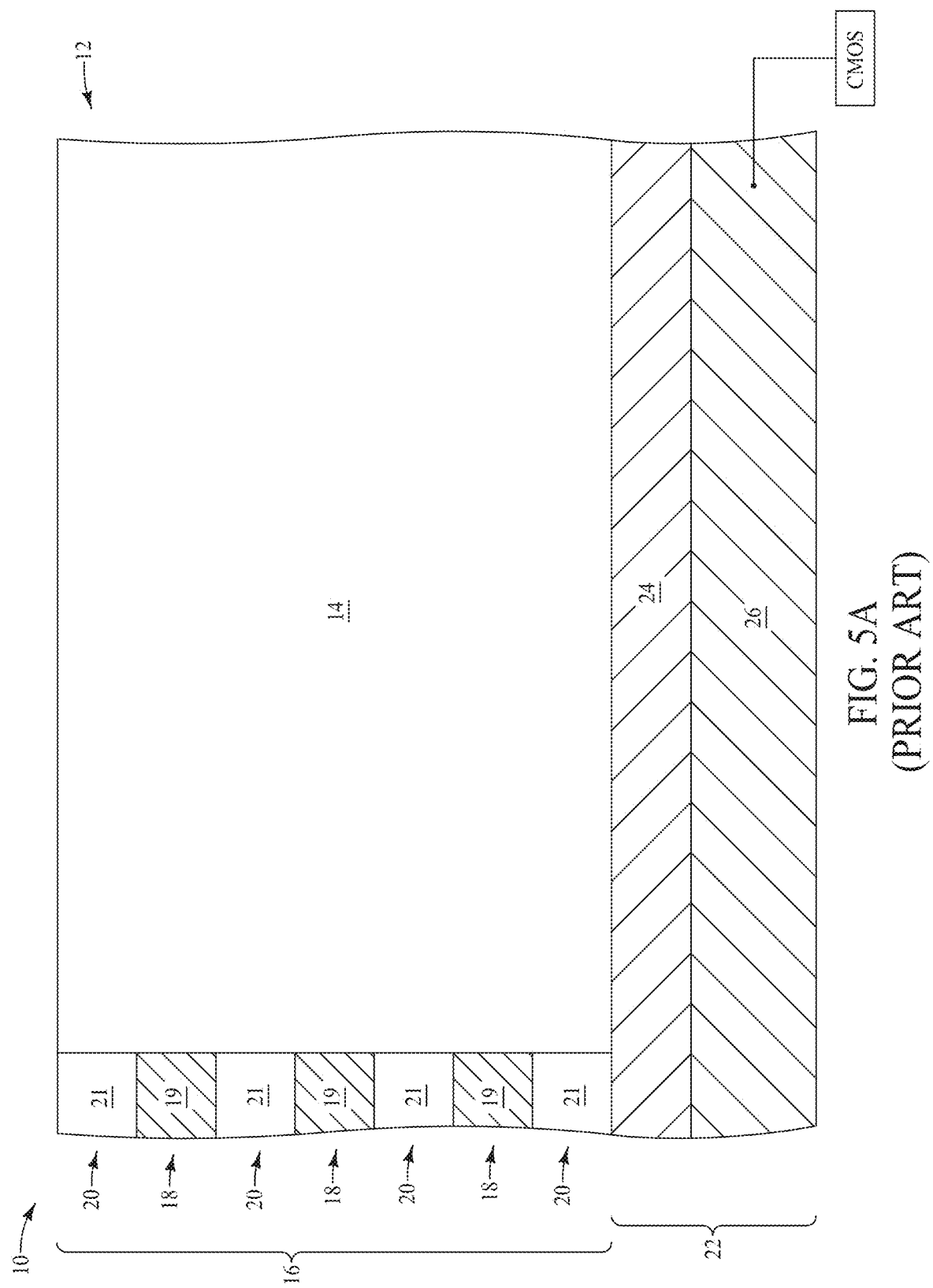
FIGS. 5A and 5B are diagrammatic cross-sectional side views along the lines A-A and B-B, respectively, of the prior art FIG. 5.
Figure 5B:
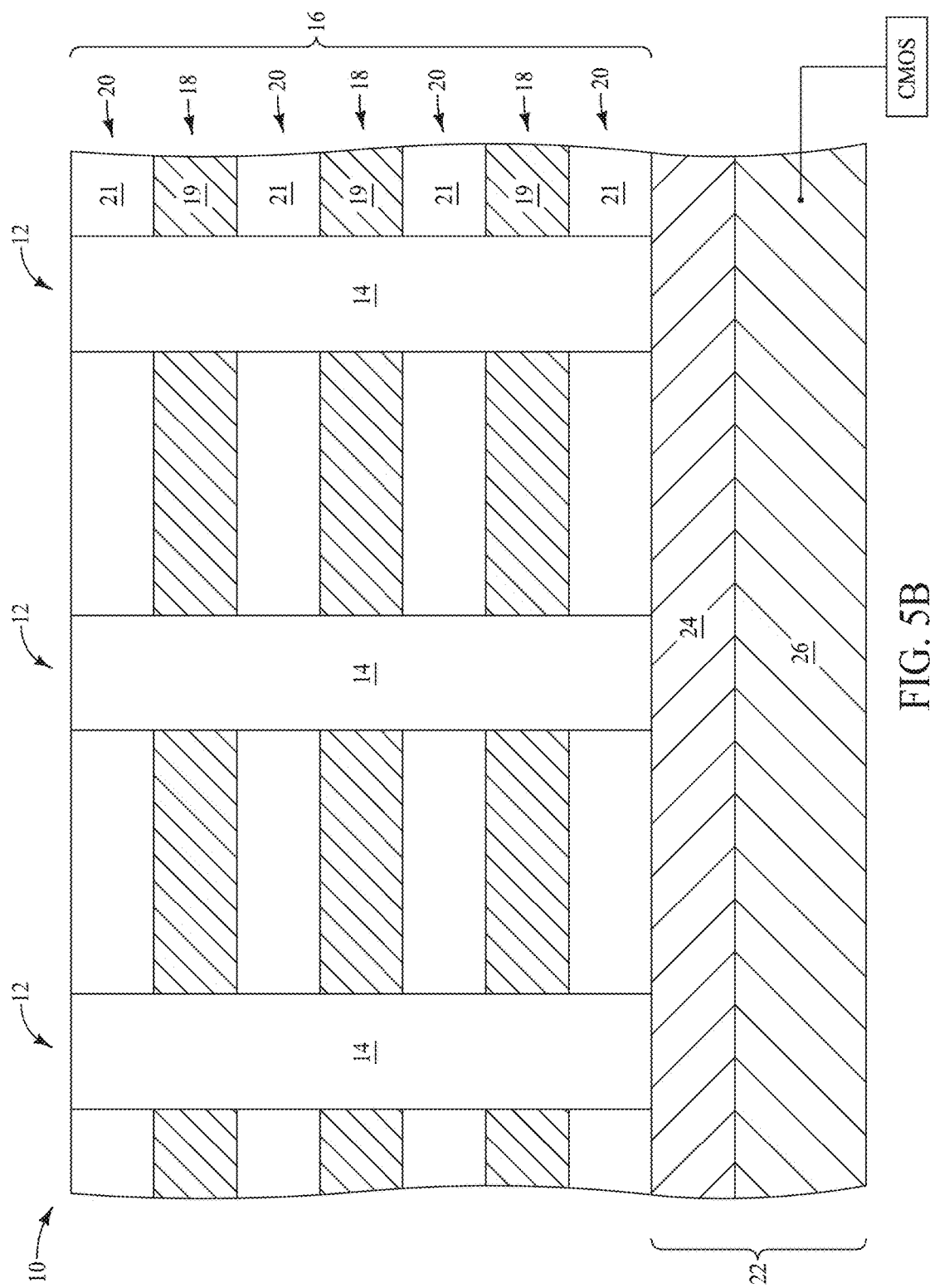

Referring to FIGS. 5-5B, regions of an example integrated assembly 10 are illustrated. The assembly includes a block region (labeled "Block") which is subdivided amongst a pair of the sub-blocks (labeled "Sub-block$_1$" and "Sub-block$_2$"). The block region is within a tile region (labeled "Tile"). The sub-blocks, block and tile may be arranged in configurations suitable for three-dimensional NAND architecture, such as, for example, architectures of the types described above in FIGS. 1-4.

A partition 12 extends around the sub-blocks, and separates the sub-blocks from one another. The partition 12 comprises a partition material 14. The partition material 14 may comprise any suitable composition(s); and in some embodiments may comprise, consist essentially of, or consist of silicon dioxide.

The block is laterally offset from a staircase region (labeled "Staircase Region"), which is a region where electrical contact is made to stacked conductive levels within the sub-blocks.

The cross-sectional views of FIGS. 5A and 5B show that the assembly 10 includes a stack 16 of alternating conductive levels 18 and insulative levels 20. The levels 18 comprise conductive material 19, and the levels 20 comprise insulative material 21.

The conductive material 19 may comprise any suitable electrically conductive composition(s), such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 19 may include metal (e.g., tungsten) and metal nitride (e.g., tantalum nitride, titanium nitride, etc.).

The insulative material 21 may comprise any suitable composition(s); and in some embodiments may comprise, consist essentially of, or consist of silicon dioxide.

The levels 18 and 20 may be of any suitable thicknesses; and may be the same thickness as one another, or different thicknesses relative to one another. In some embodiments, the levels 18 and 20 may have vertical thicknesses within a range of from about 10 nanometers (nm) to about 400 nm.

In some embodiments, the lower conductive level may be representative of a source-select device (e.g., source-side select gate, SGS); and the upper conductive levels may be representative of wordline levels. The source-select-device level may or may not comprise the same conductive material(s) as the wordline levels.

Although only three conductive levels 18 are shown in FIGS. 5A and 5B in order to simplify the drawings, in practice there may be substantially more than three conductive levels in the stack 16. For instance, the wordline levels may ultimately correspond to memory cell levels of a NAND configuration. The NAND configuration will include strings of memory cells (i.e., NAND strings), with the number of memory cells in the strings being determined by the number of vertically-stacked wordline levels. The NAND strings may comprise any suitable number of memory cell levels. For instance, the NAND strings may have 8 memory cell levels, 16 and memory cell levels, 32 memory cell levels, 64 memory cell levels, 512 memory cell levels, 1024 memory cell levels, etc. Also, the source-select device may include more than one conductive level.

The stack 16 and partition 12 are supported over a conductive structure 22. Such conductive structure comprises semiconductor material 24 over the metal-containing material 26. In the illustrated embodiment, the semiconductor material 24 is directly against the metal-containing material 26.

The semiconductor material 24 may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the semiconductor material 24 may comprise conductively-doped silicon; such as, for example, n-type doped polysilicon.

The metal-containing material 26 may comprise any suitable composition(s), such as, for example, one or more of various metals (e.g., titanium, tungsten, cobalt, nickel, platinum, ruthenium, etc.) and/or metal-containing compositions (e.g., metal silicide, metal nitride, metal carbide, etc.).

In some embodiments, the conductive structure 22 may correspond to a source structure (e.g., a structure comprising the so-called common source line 216 of FIG. 4). The source structures of FIGS. 1-4 are referred to as "lines" in accordance with traditional nomenclature, but such lines may be comprised by an expanse rather than a simple wiring line; such as the expanse shown in FIGS. 5A and 5B as structure 22.

Vertically-stacked memory cells (not shown in FIGS. 5-5B) may be provided within the stack 16 along the conductive wordline levels. Such memory cells may be arranged in vertical NAND strings of the types described in FIGS. 1-4. The NAND strings may comprise channel material pillars which extend through the stack 16, with the channel material being electrically coupled with the semiconductor material 24 of the conductive structure 22. The channel material pillars may be arranged within the sub-blocks in any suitable configuration; and in some embodiments may be in a tightly-packed arrangement, such as, for example, a hexagonally-packed arrangement.

The conductive structure 22 may be supported by a semiconductor substrate (not shown). The term "semiconductor substrate" means any construction comprising semiconductive material, including, hut not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above.

The conductive structure 22 is shown to be electrically coupled with CMOS (complementary metal oxide semiconductor). The CMOS may be in any suitable location relative to the conductive structure 22, and in some embodiments may be under such conductive structure. The CMOS may comprise logic or other appropriate circuitry for driving the source structure 22 during operation of memory associated with the stack 16. Although the circuitry is specifically identified to be CMOS in the embodiment of FIGS. 5A and 5B, it is to be understood that such circuitry could be replaced with any other suitable circuitry in other embodiments.

Figure 6:
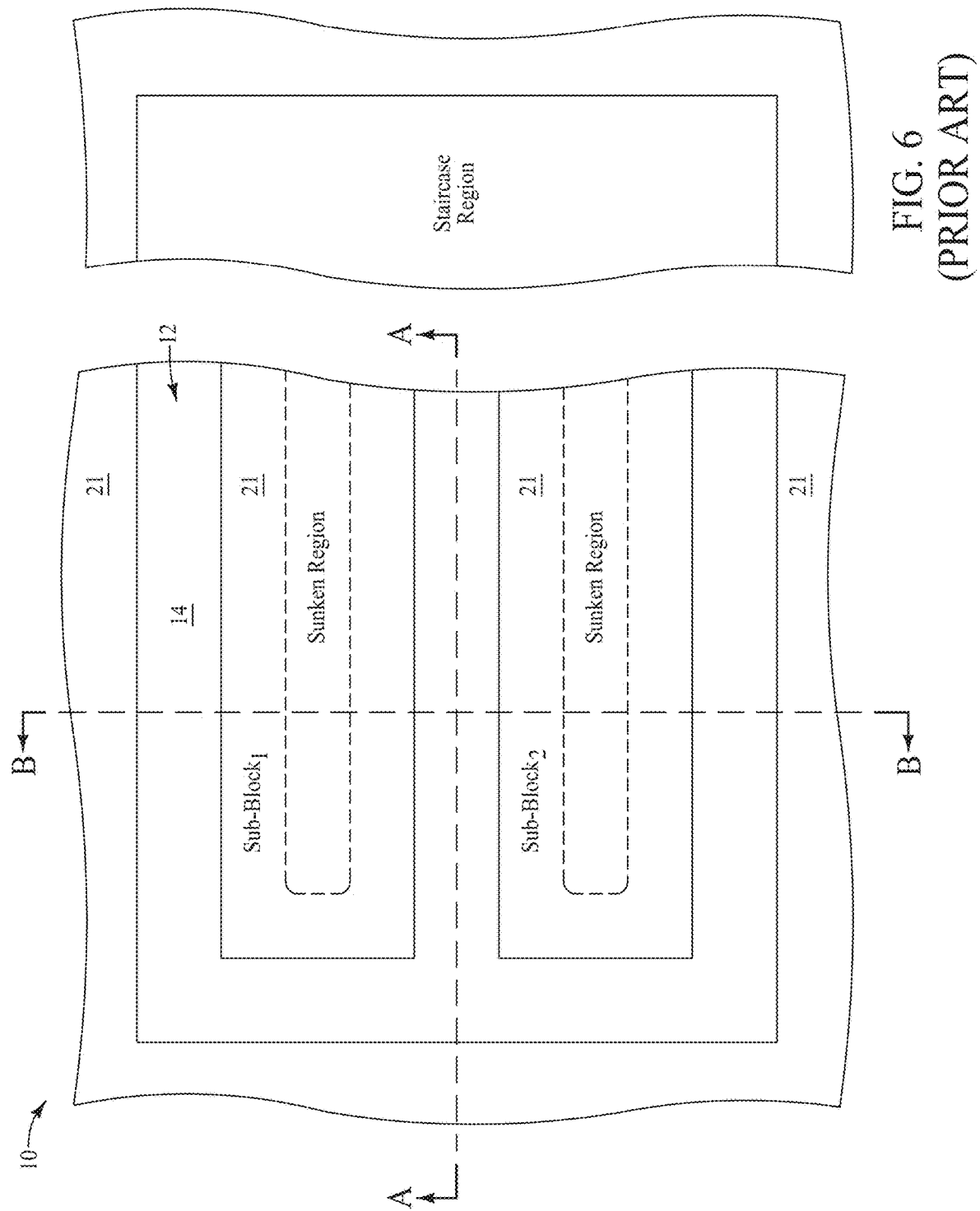
FIG. 6 is a diagrammatic top view of a region of a prior art integrated assembly illustrating another example architecture.
Figure 6A:
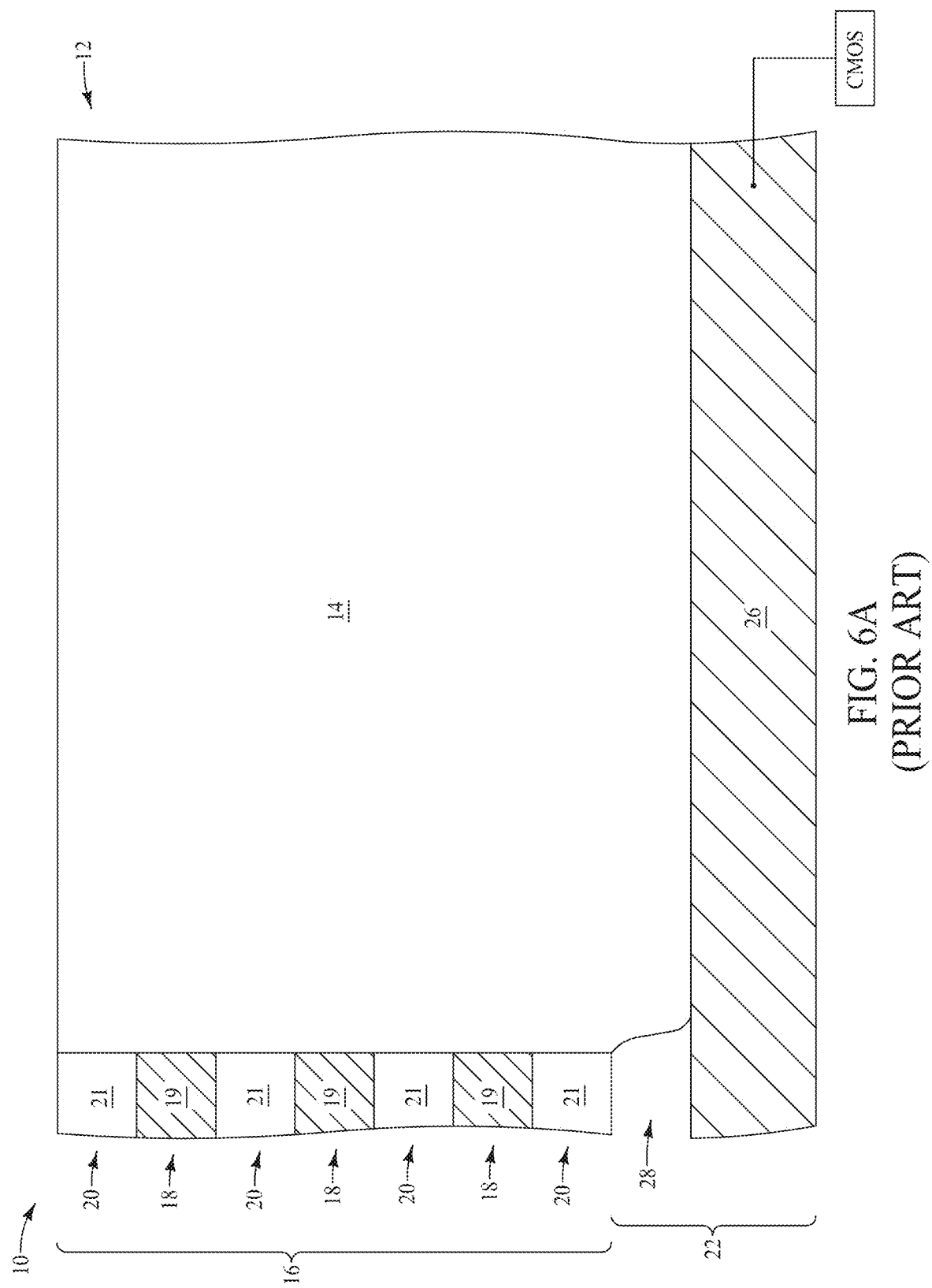
FIGS. 6A and 6B are diagrammatic cross-sectional side views along the lines A-A and B-B, respectively, of the prior art FIG. 6.
Figure 6B:
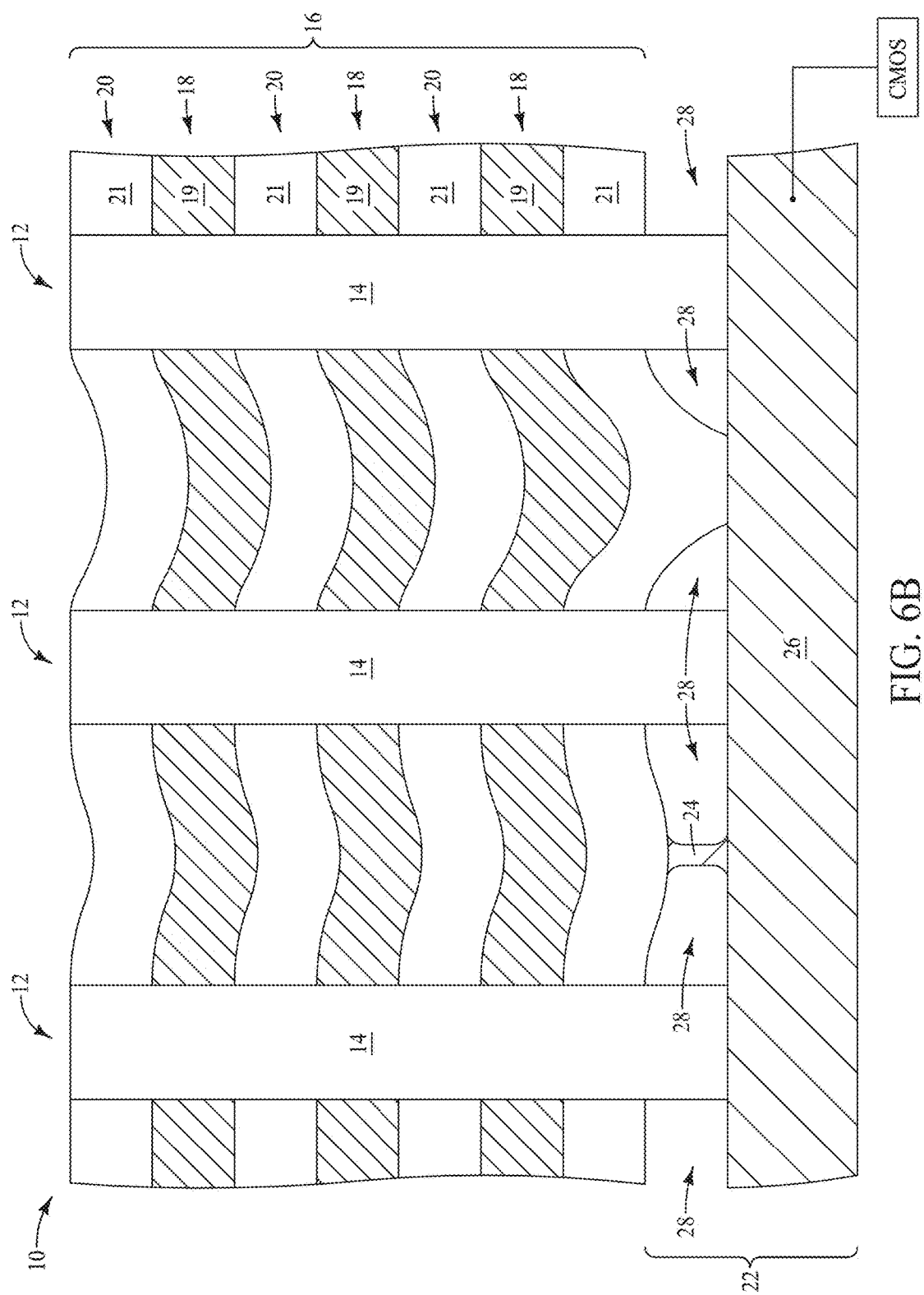

FIGS. 5-5B show a desired arrangement in which the stack 16 is supported over the conductive structure 22. However, in practice is sometimes found that the actual arrangement has a warped, or broken stack as shown in FIGS. 6-6B. Specifically, FIGS. 6-6B show the assembly 10 after processing has undesirably removed a substantial amount of the semiconductor material 24 of conductive structure 22, leading to formation of voids 28 between the stack 16 and the conductive material 26. The voids 28 may cause partial and/or total collapse of some of the regions of the stack 16; which may detrimentally alter device performance, and which may even lead to device failure. Sunken regions of the stack 16 are diagrammatically indicated as being within dashed-line regions in the top view of FIG. 6.

One aspect of the invention described herein is recognition that the voids 28 may result from galvanic corrosion of the semiconductor material 24, as discussed with reference to FIGS. 7-10.

Figure 7:
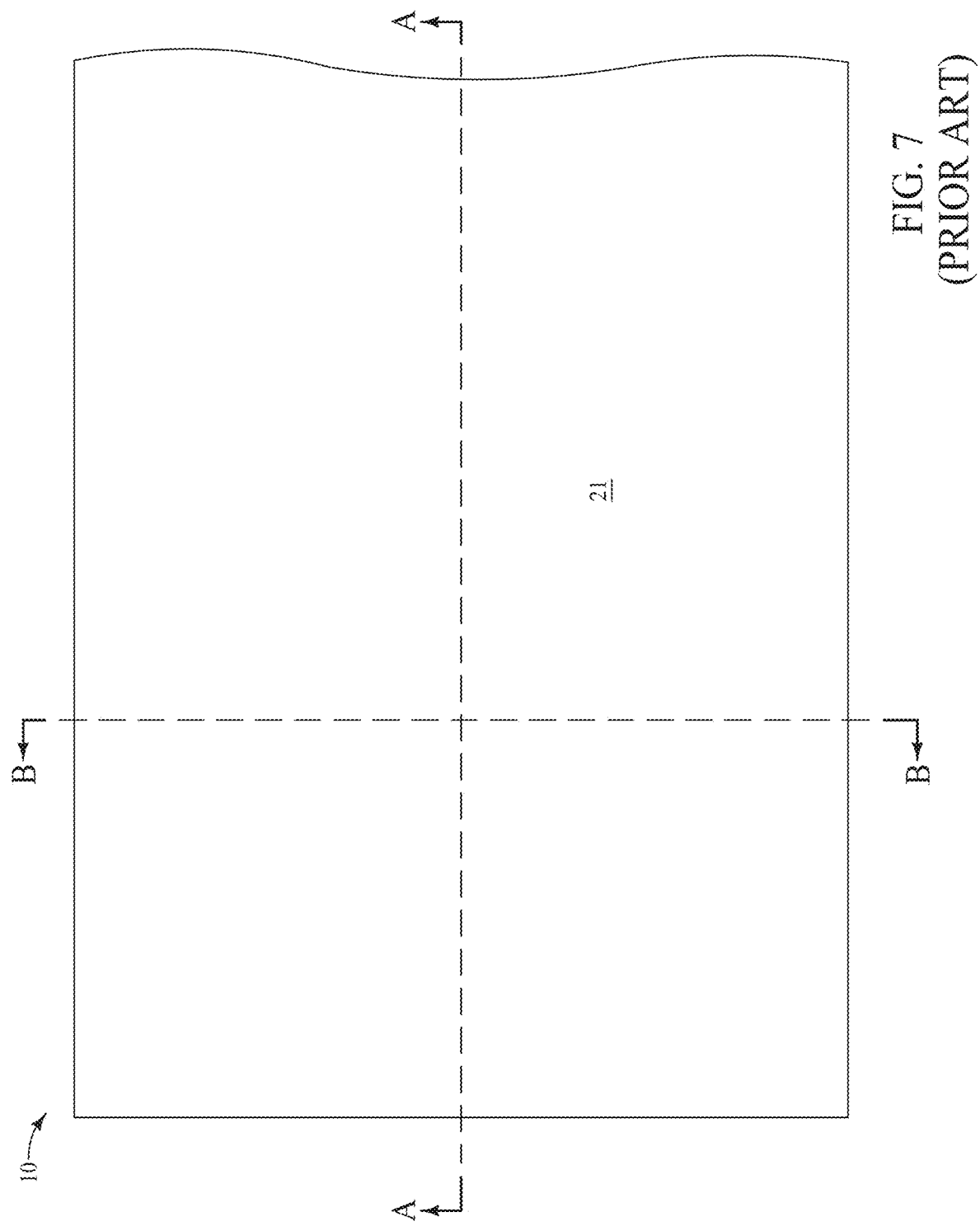
FIGS. 7-10 are diagrammatic top views of a region of a prior art integrated assembly at example process stages of an example method for fabricating an example structure.
Figure 7A:
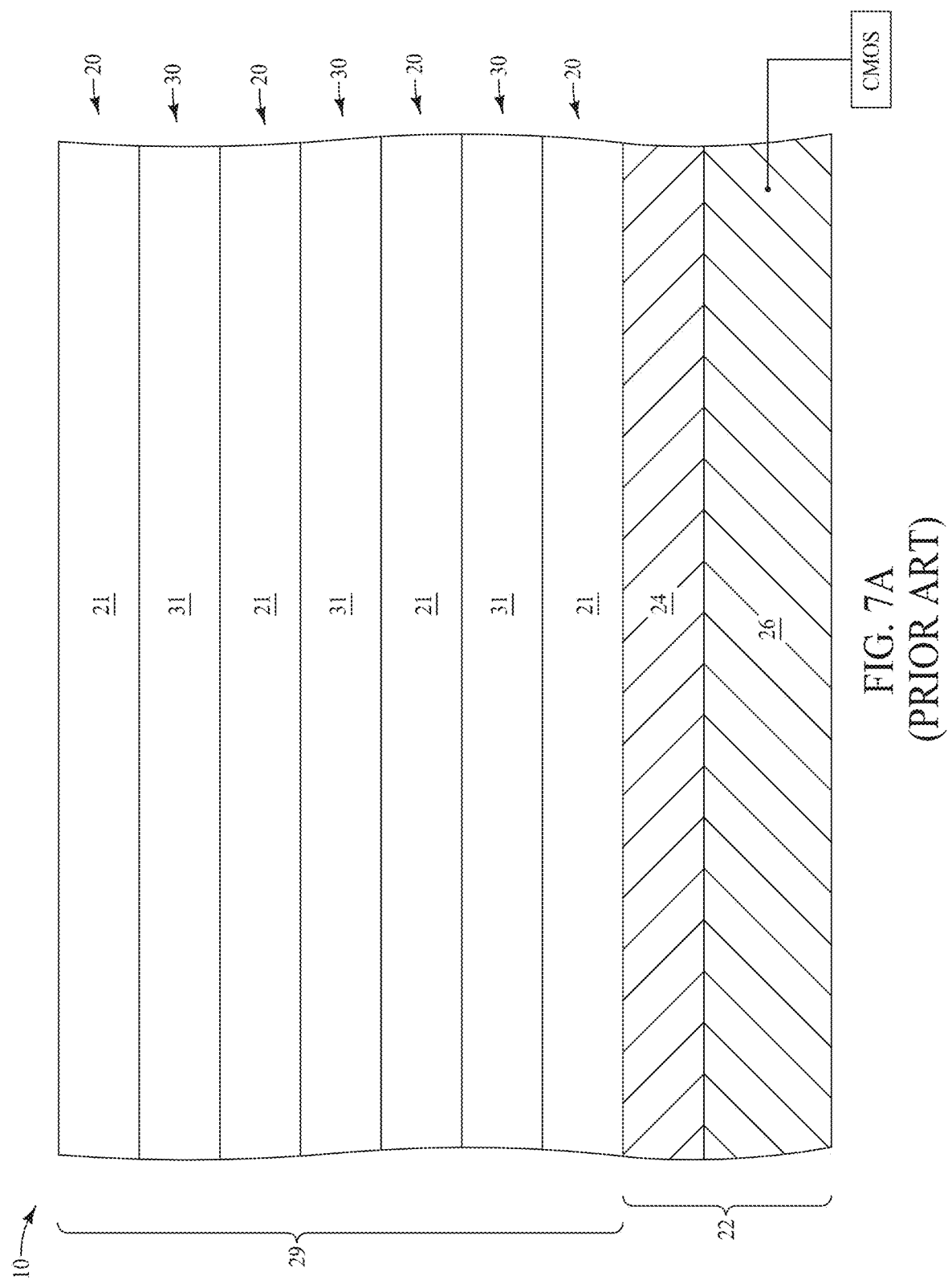
Figure 7B:
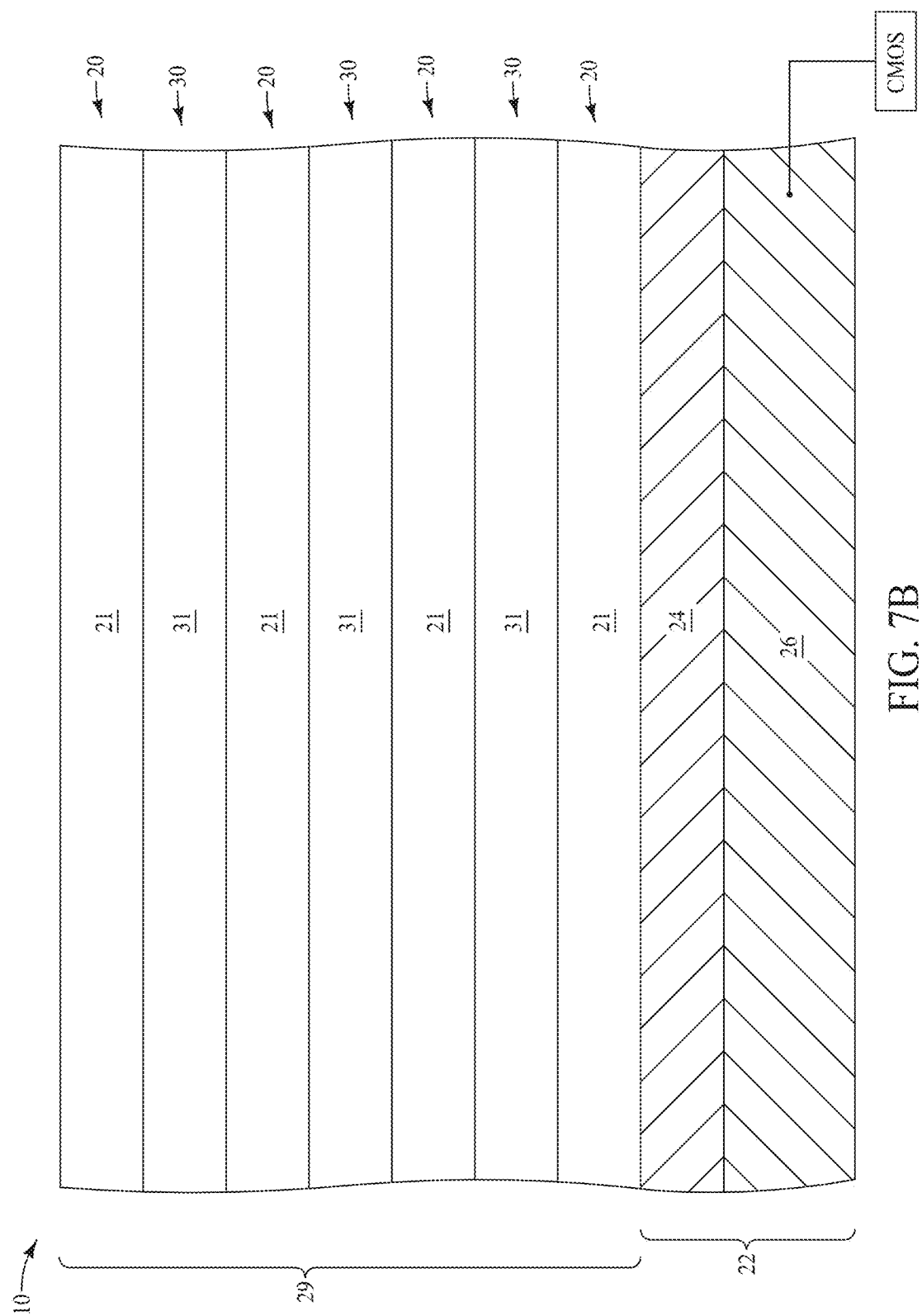

Referring to FIGS. 7-7B, a region of assembly 10 is shown at a process stage during fabrication of the conductive wordlines of stack 16 (with the conductive wordlines ultimately being within the conductive levels 18 described above with reference to FIG. 5). The staircase region is not shown in order to simplify the discussion of the processing. It was noted above in describing FIG. 5 that the upper conductive levels 18 may correspond to wordlines and the lower level(s) may correspond to one more select device levels. The processing described herein forms all of the levels 18 identically with a gate-replacement process (described in FIGS. 7-10). In other embodiments, the select device levels may not be subjected to the gate replacement processing.

The assembly 10 of FIGS. 7-7B includes a stack 29 of alternating first and second levels 30 and 20. The second levels 20 are identical to the insulative levels 20 described above with reference to FIGS. 5-5B, and comprise the insulative material 21. The first levels 30 comprise sacrificial material 31. Such sacrificial material may comprise any suitable composition(s); and in some embodiments may comprise, consist essentially of, or consist of silicon nitride.

The stack 29 is supported over the conductive structure 22. In the illustrated embodiment, the conductive structure 22 is coupled with CMOS at the processing stage of FIGS. 7-7B. In other embodiments, the coupling to the CMOS may be provided at a subsequent process stage.

Figure 8:
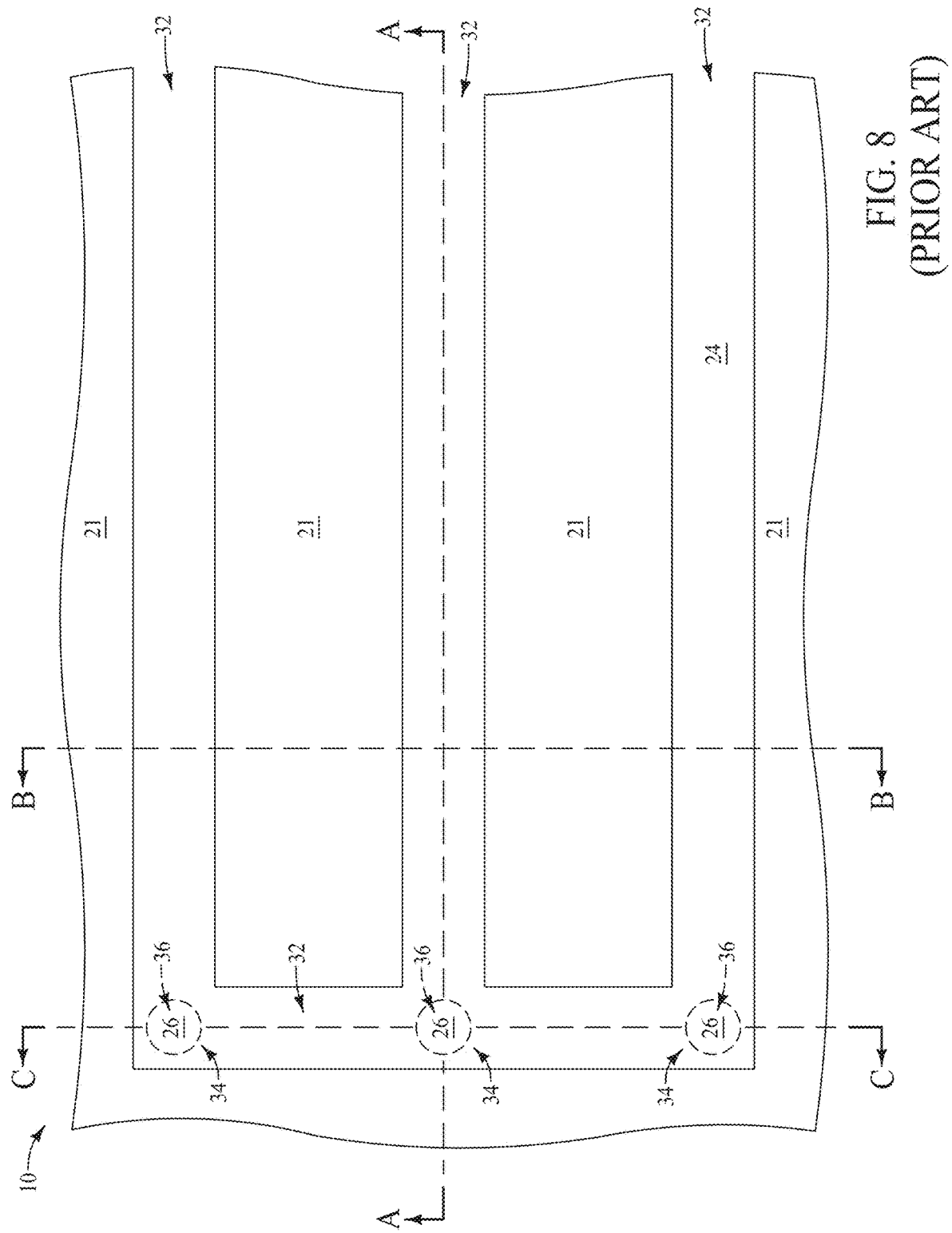
Figure 8A:
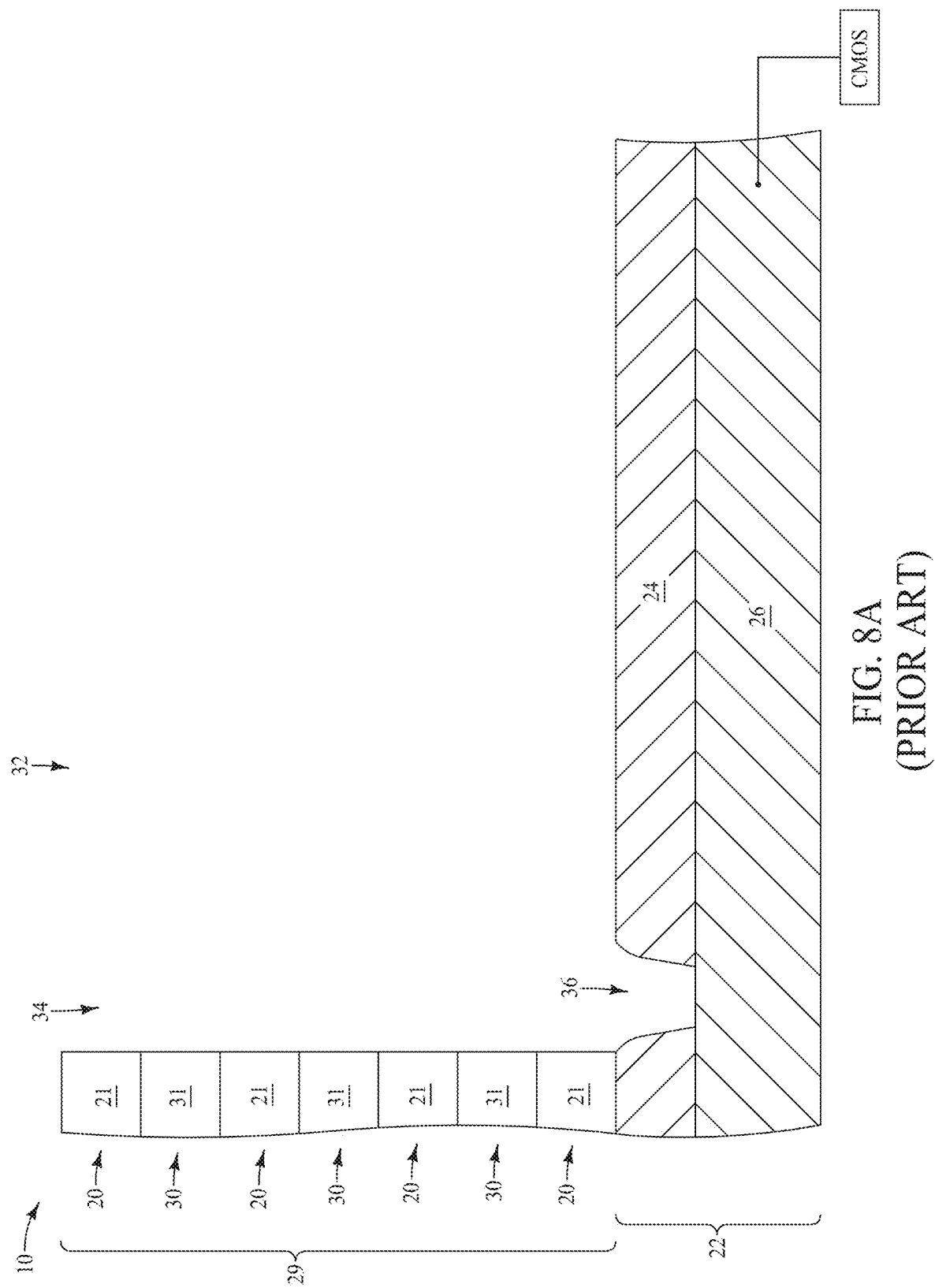
FIG. 8C is a diagrammatic cross-sectional side view along the line C-C of prior art FIG. 8.
Figure 8B:
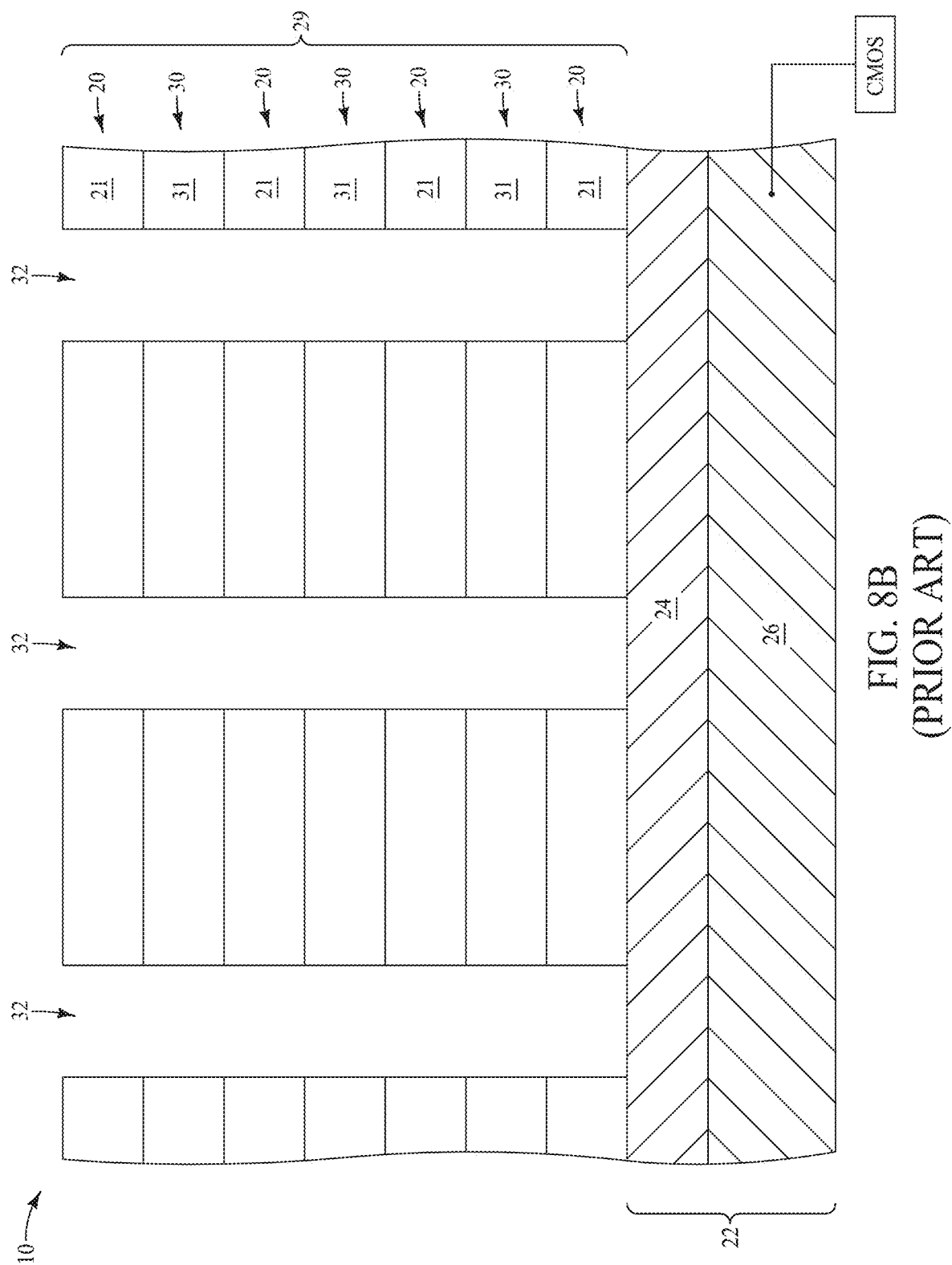
Figure 8C:
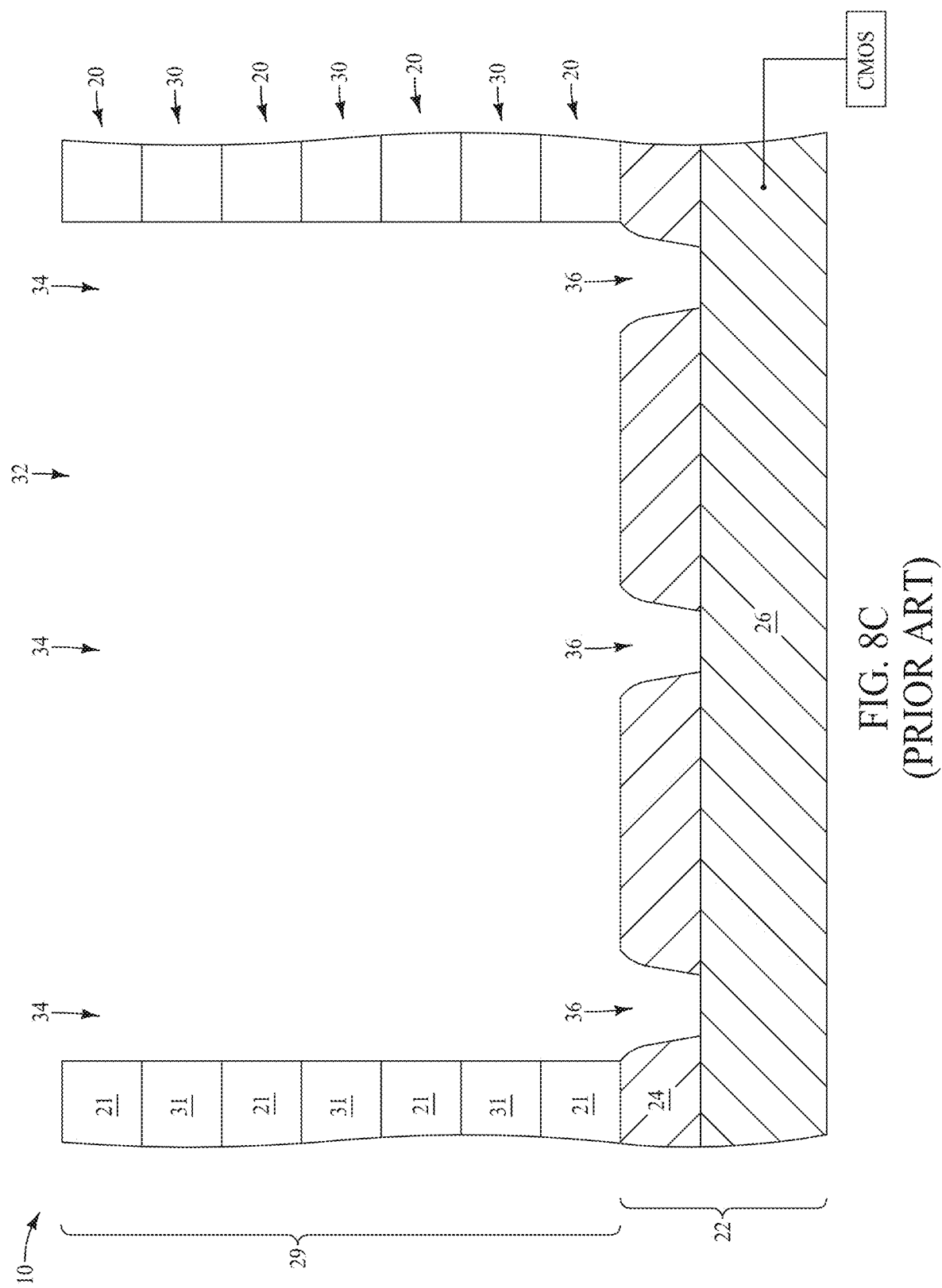

Referring to FIGS. 8-8C, slits 32 are formed through the stack 29 to the conductive structure 22. The slits 32 join to one another at intersect regions 34. The intersect regions are wider than other portions of the slits, and accordingly the etching utilized to form the slits may form cavities 36 in the semiconductor material 24 at the intersect regions 34 during the duration of the etch utilized to expose semiconductor material 24 at the non-intersect regions of the slits 32. At least one of the cavities 36 may extend through the semiconductor material 24 to expose the metal-containing material 26 of the conductive structure 22.

Figure 9:
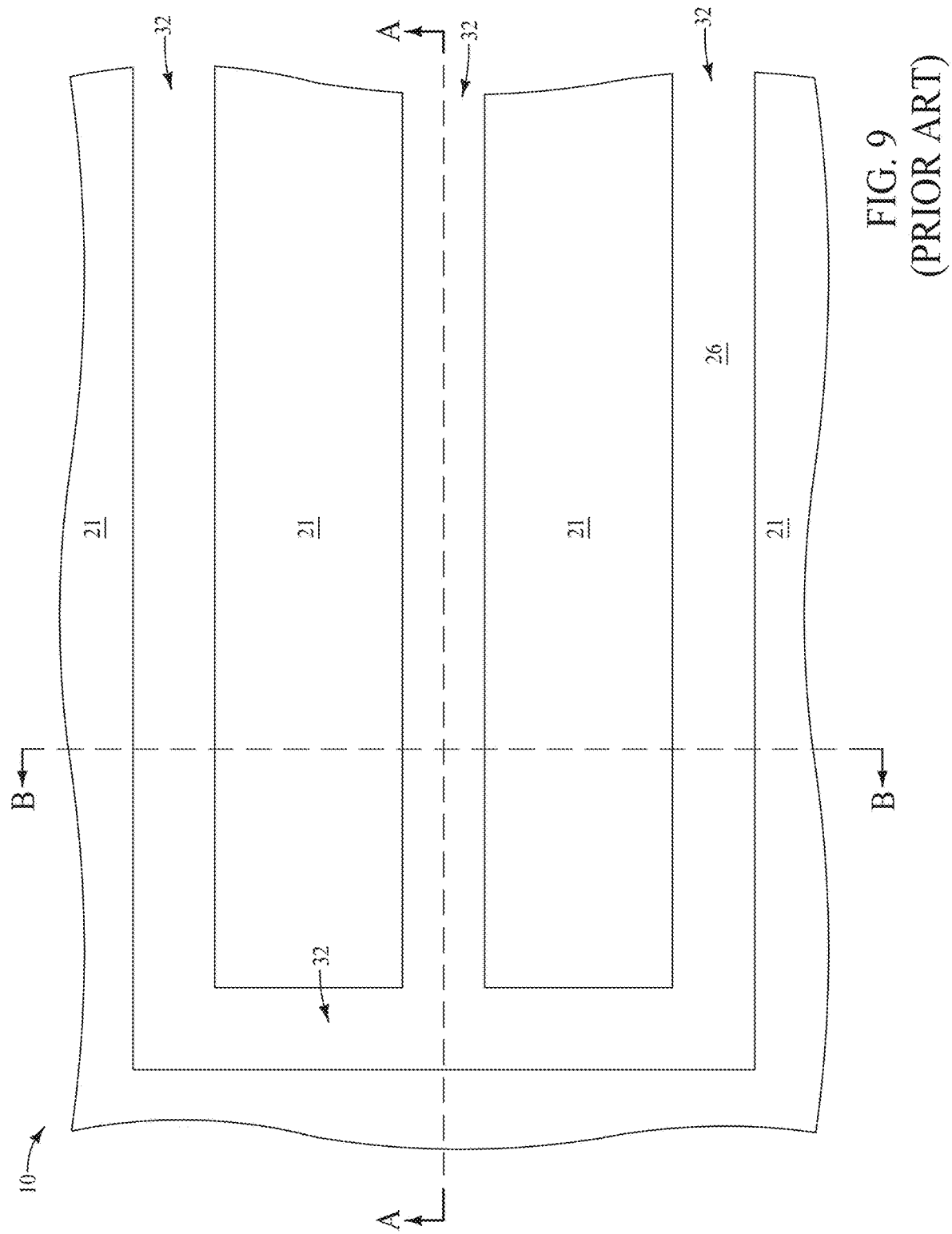
Figure 9A:
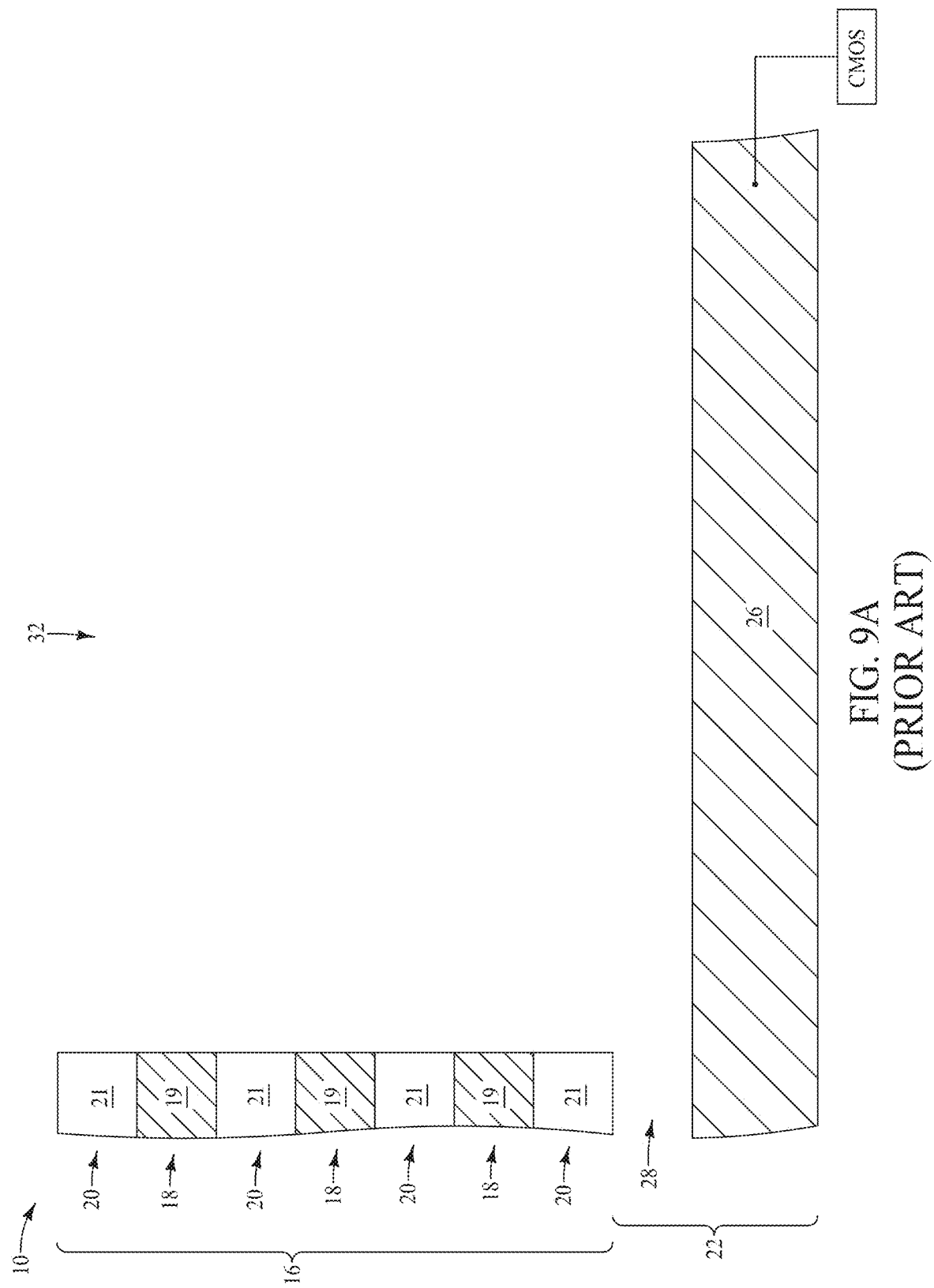
Figure 9B:
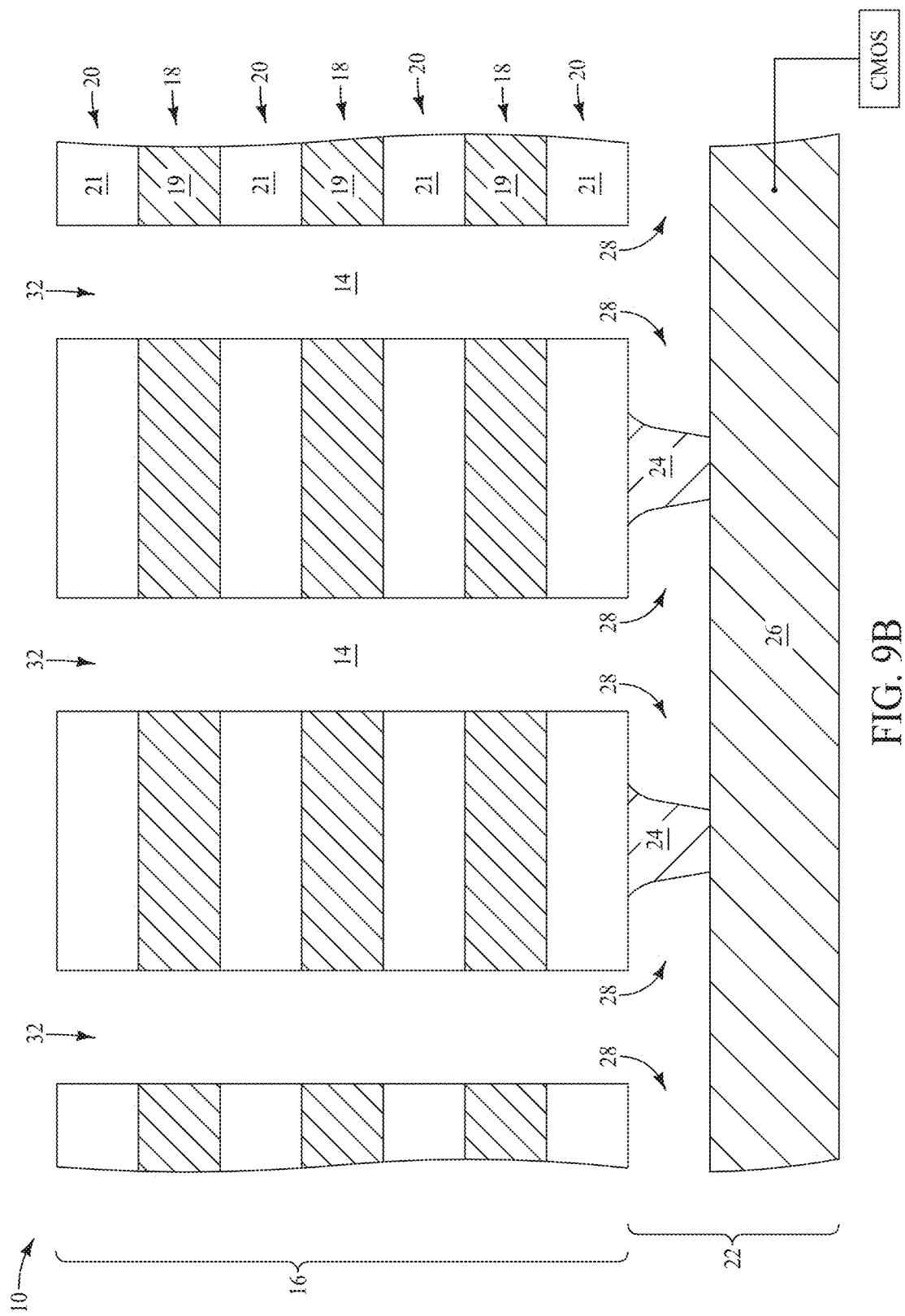

Referring to FIGS. 9-9B, the sacrificial material 31 (FIGS. 8-8C) is replaced with conductive material 19 to form the stack 16 described above with reference to FIGS. 5-5B. Such replacement may utilize an etch to remove the sacrificial 31 (for instance, an etch selective for silicon nitride relative to silicon dioxide in applications in which the sacrificial material 31 comprises silicon nitride and the insulative material 21 comprises silicon dioxide), followed by deposition of the conductive material 19, and then followed by suitable etching to remove excess conductive material 19 from within the slits 32.

The semiconductor material 24 (e.g., conductively-doped silicon) would generally be resistant to the various etches utilized during the replacement of the sacrificial material 31 with the conductive material 19. However, the exposure of conductive material 26 within the cavities 36 (as shown in FIGS. 8A and 8C) enables a galvanic reaction to occur during one or more of the etches which undesirably removes some of the conductive material 24, and thereby forms the voids 28. The galvanic reaction is described as a possible mechanism for the removal of the semiconductor material 24 to assist the reader in understanding the invention described herein. The actual mechanism underlying the removal of the semiconductor material 24 may involve other reactions in addition to, or alternatively to, the galvanic reaction described herein. The claims that follow are not to be limited to any specific reaction mechanism described herein except to the extent, if any, that such reaction mechanism is specifically recited in the claims.

Figure 10:
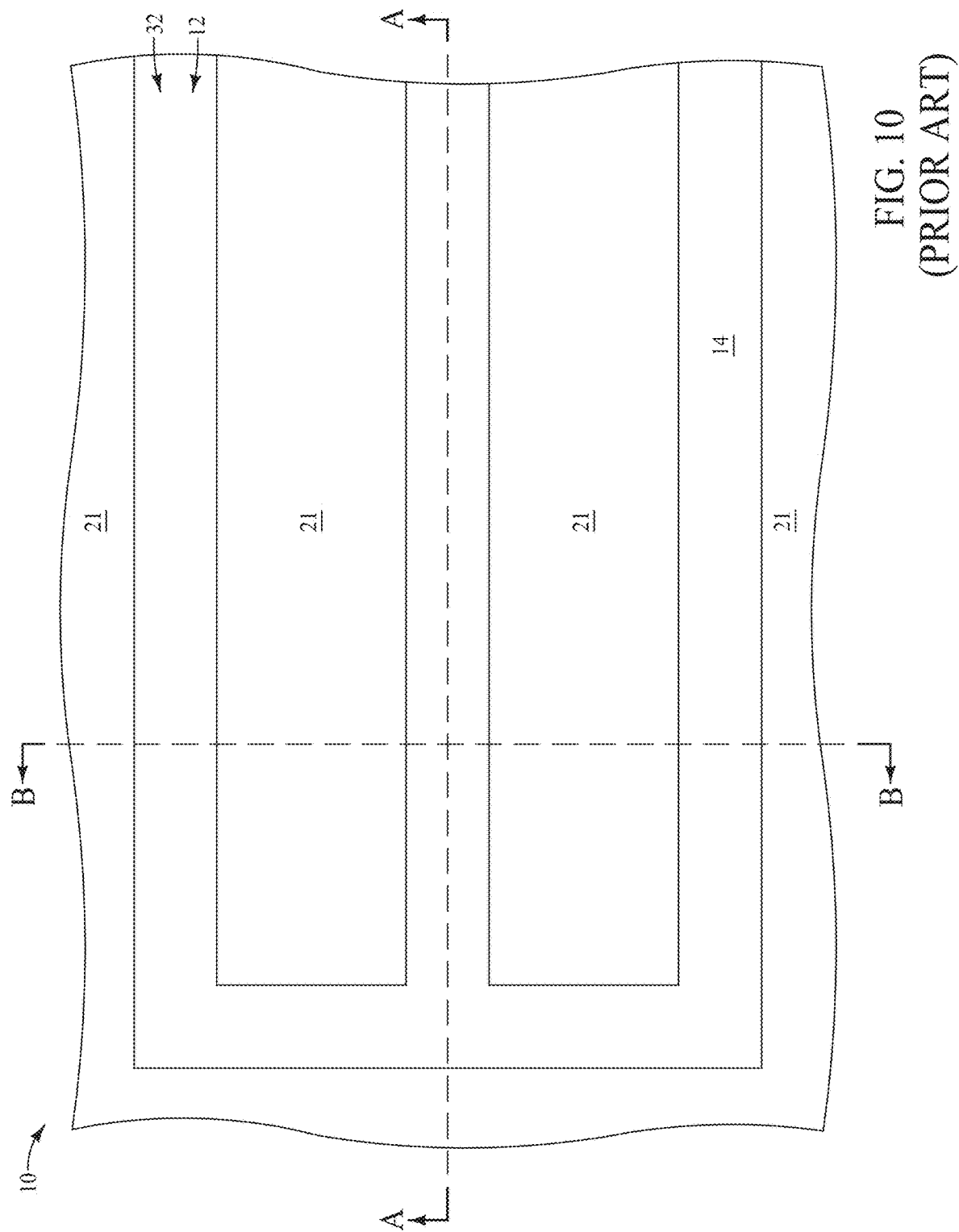
Figure 10B:
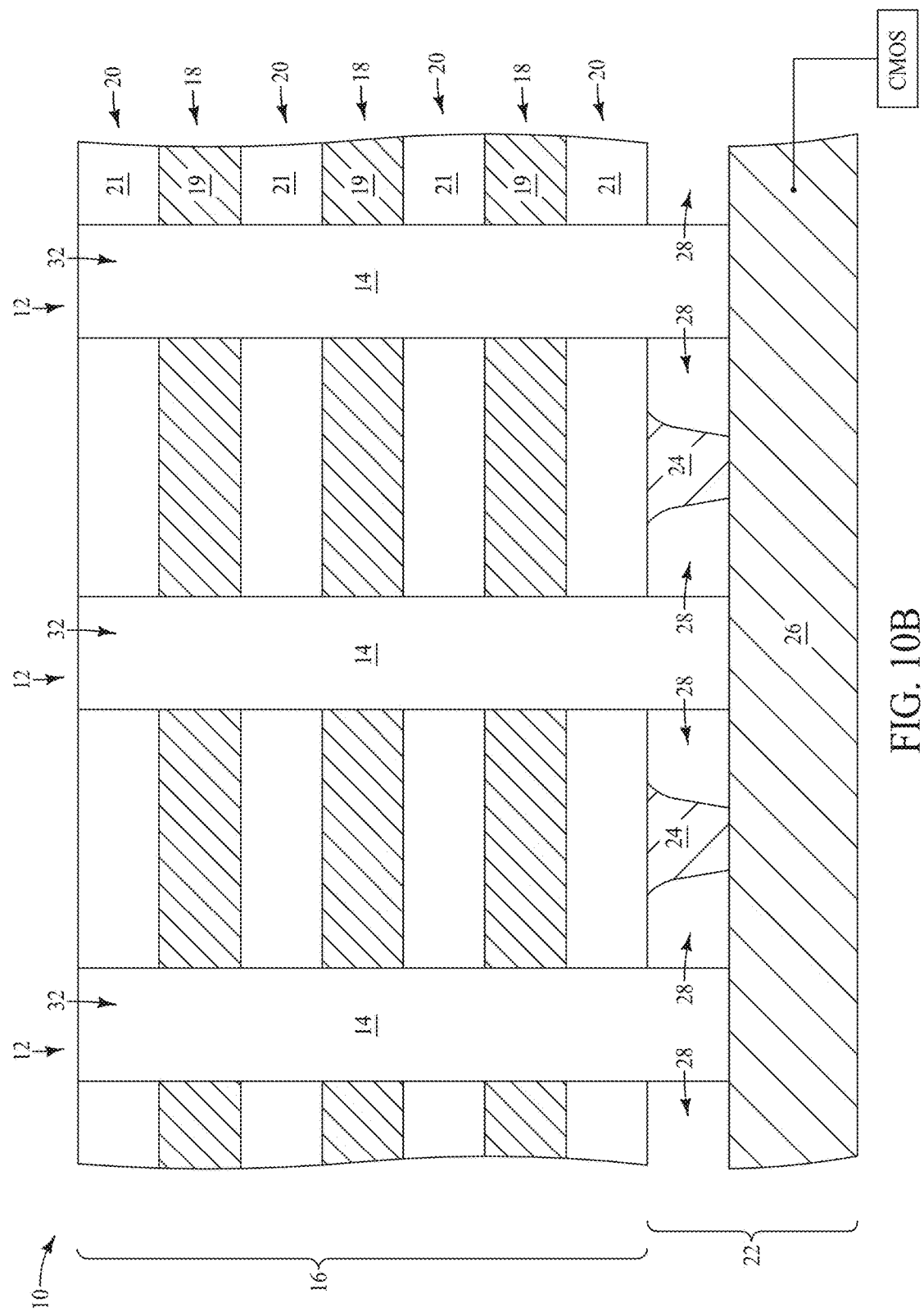

Referring to FIGS. 10-10B, insulative material 14 is formed within the slits 32 to thereby form the partition 12 described above with reference to FIGS. 5-5B. Unfortunately, the voids 28 weaken the support under regions of stack 16, which can lead to the warping, collapse, etc., described above with reference to FIGS. 6-6B.

Some embodiments include configurations which may prevent the problems described with reference to FIGS. 6-10. FIGS. 11-14 describe an example configuration, and describe an example method in which such configuration may prevent the problems described above with reference to FIGS. 6-10.

Figure 11:
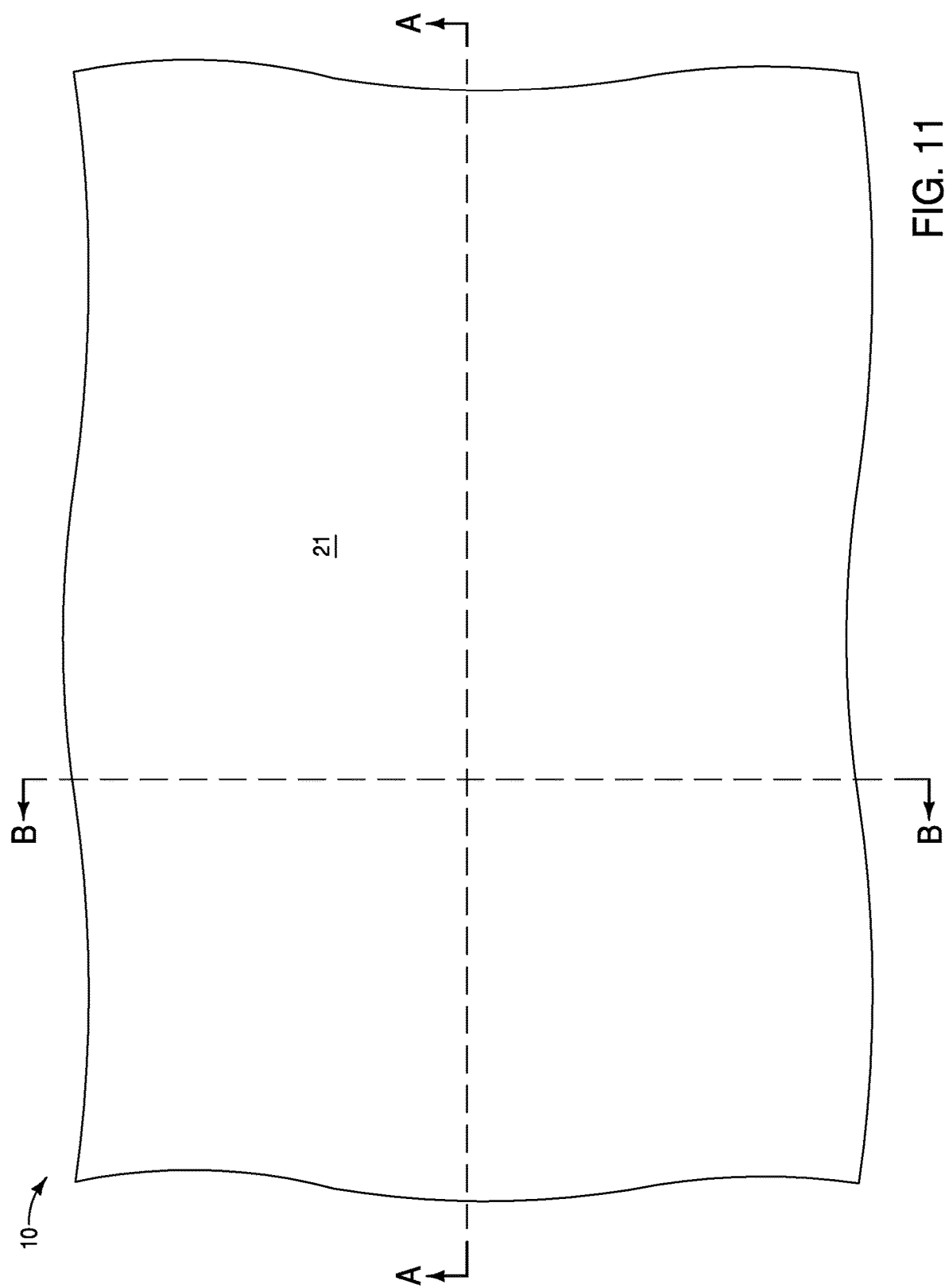
FIGS. 11-14 are diagrammatic top views of a region of an integrated assembly at example process stages of an example method for fabricating an example structure.
Figure 11B:
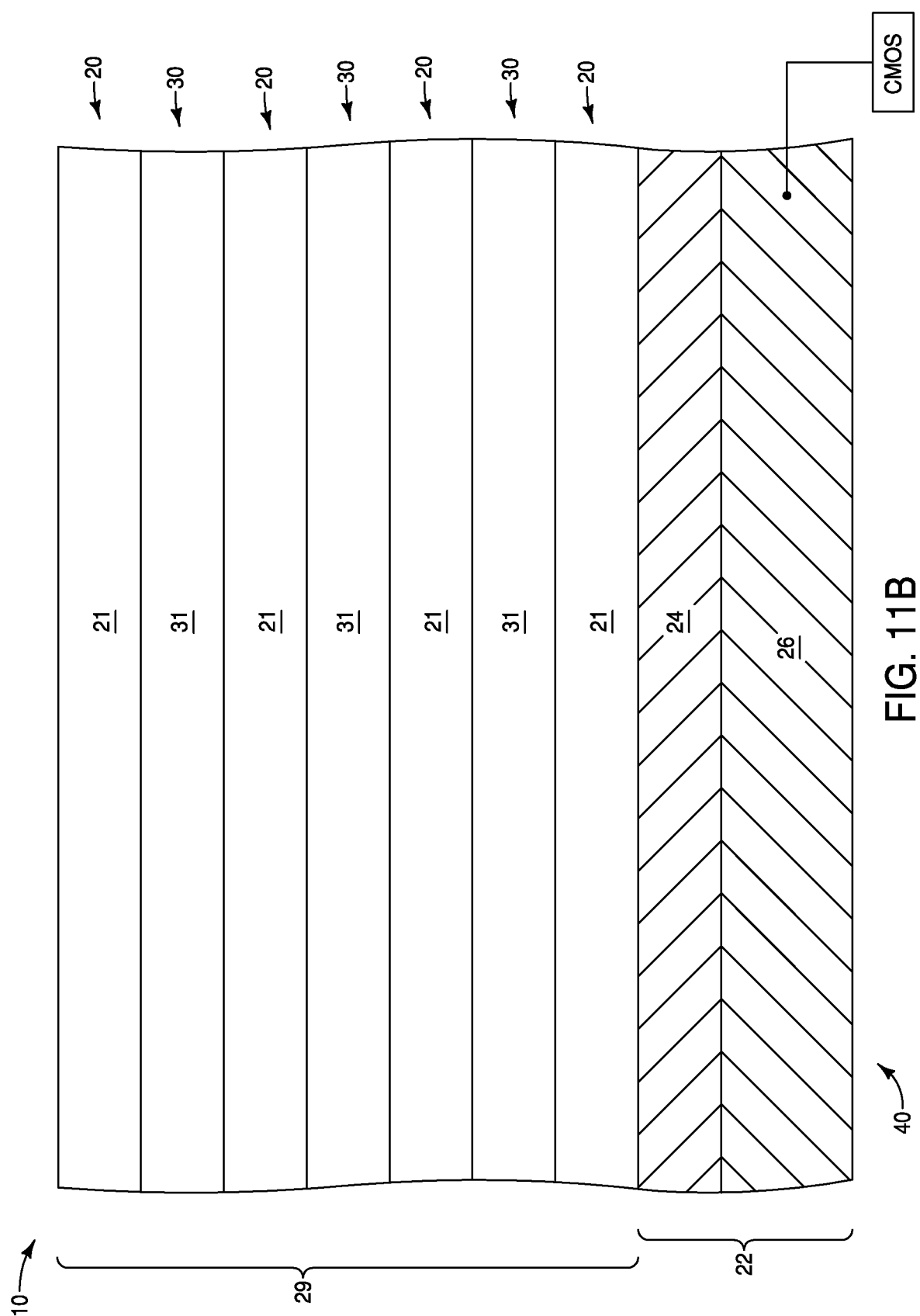

Referring to FIGS. 11-11B, construction 10 is shown at a processing stage analogous to that described above with reference to FIGS. 7-7B. The construction of FIGS. 11-11B includes the stack 29 having the alternating first and second levels 20 and 30.

The embodiment of FIGS. 11-11B differs from that of FIGS. 7-7B in that the conductive structure 22 comprises first and second portions 38 and 40, as shown in FIG. 11A. The first portion 38 comprises a thicker region of the semiconductor material 24 than does the second portion 26. The thicker first portion 38 of the semiconductor material 24 will be in locations where the cavities 36 problematically occur in the processing described above with reference to FIGS. 8-8C. In the shown embodiment, the first portion 38 only comprises the semiconductor material 24. In other embodiments, the first portion may also comprise the metal-containing material 26, provided that the semiconductor material 24 is thick enough in the first portion 38 so that cavities formed in such first portion do not reach the metal-containing material.

In some embodiments, the conductive structure 22 may be considered to have an overall thickness T. Such overall thickness may be any suitable thickness; and in some embodiments may be within a range of from about 500 (angstroms) Å to about 5000 Å. The semiconductor material 24 may be considered to have a first thickness $T_1$ within the first portion 38 of the conductive structure 22, and to have a second thickness $T_2$ within the second portion 40 of the conductive structure 22. In some embodiments, the first thickness $T_1$ may be greater than or equal to about half of the overall thickness T (i.e., the second thickness $T_2$ may be less than or equal to about half of the overall thickness T). In the shown embodiment in which there is no metal-containing material 26 within the first portion 38, the first thickness $T_1$ of the semiconductor material 24 within the first portion 38 is equal to the overall thickness T.

Figure 12:
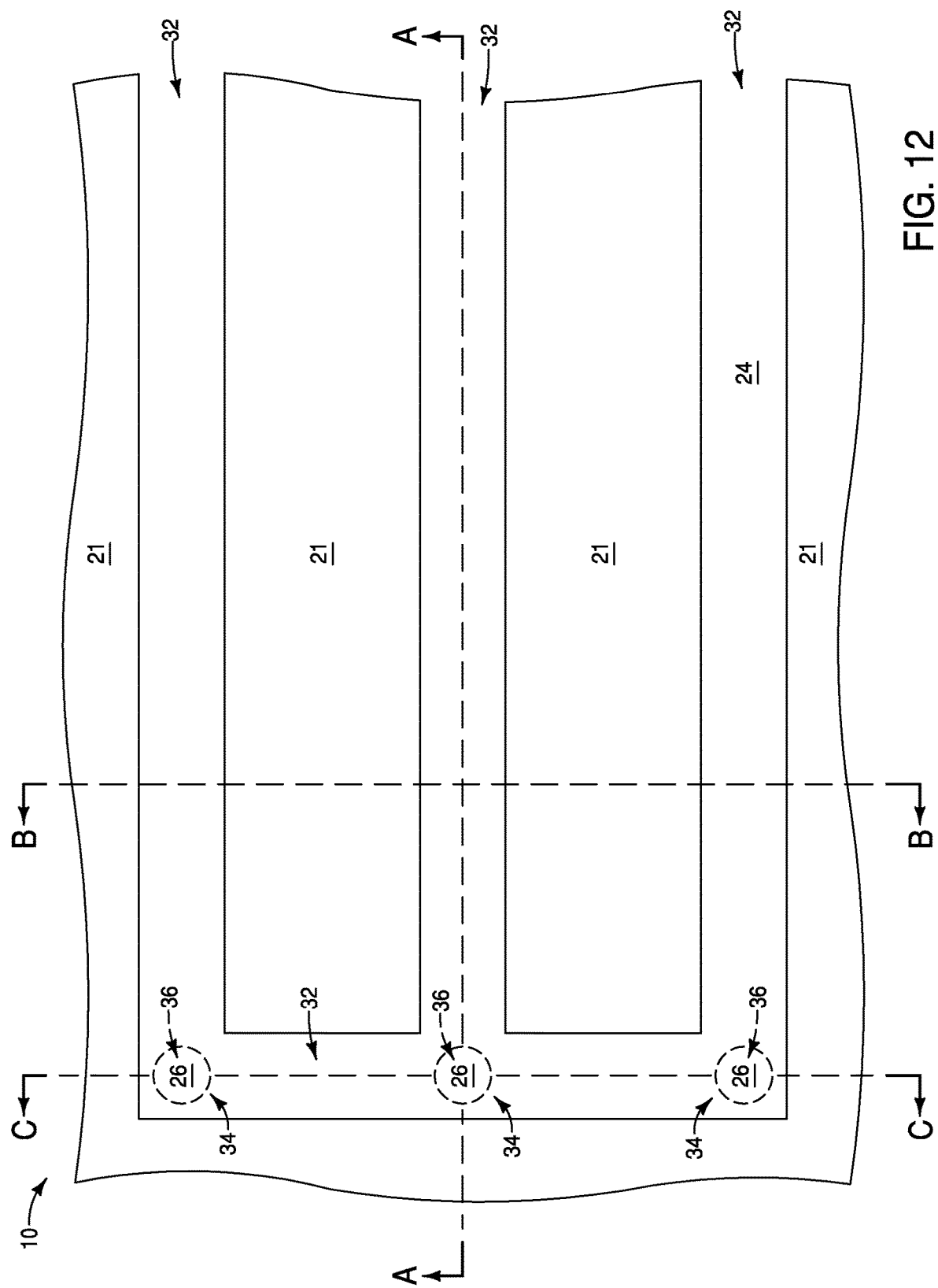
Figure 12A:
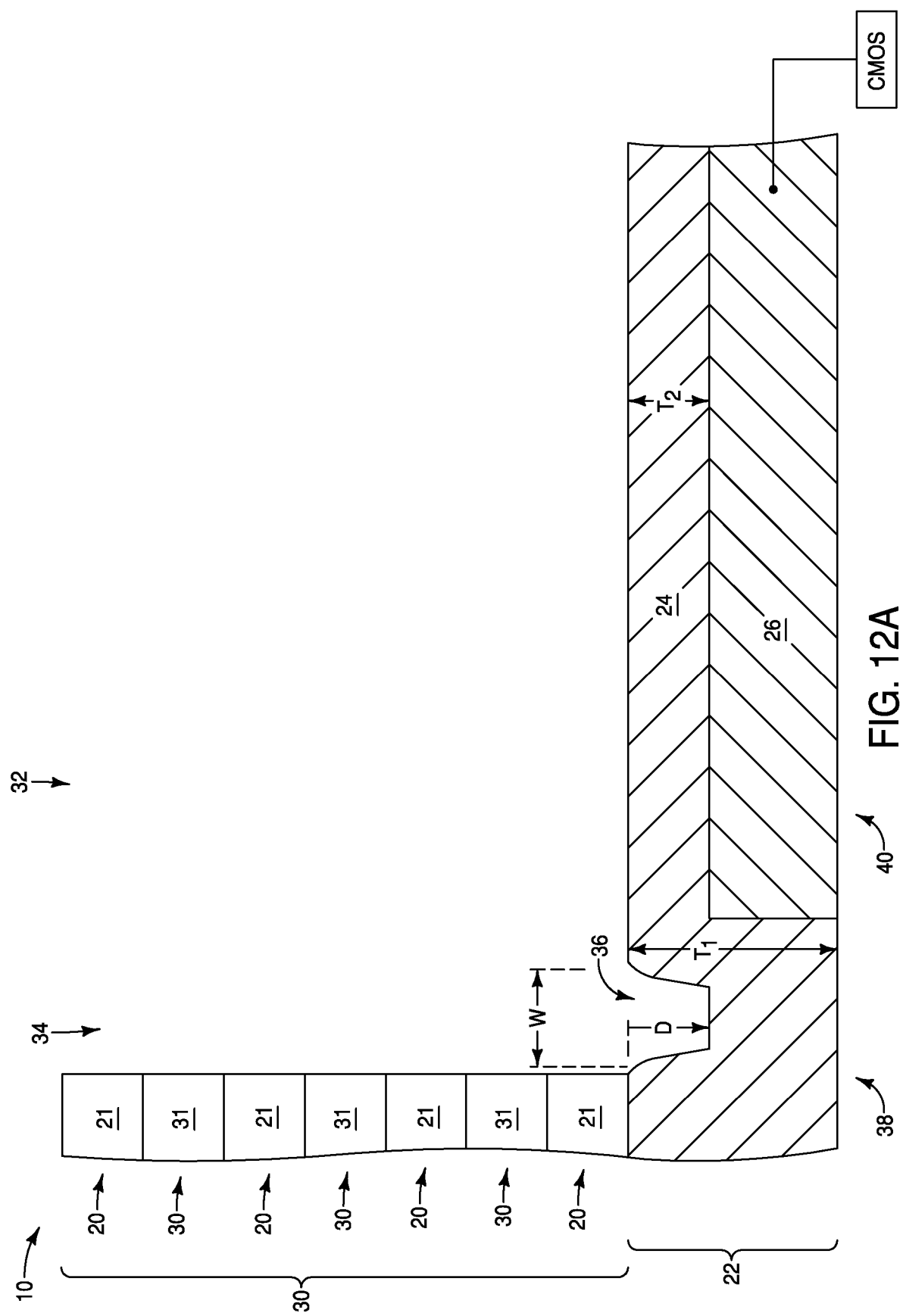
FIG. 12C is a diagrammatic cross-sectional side view along the line C-C of FIG. 12.
Figure 12B:
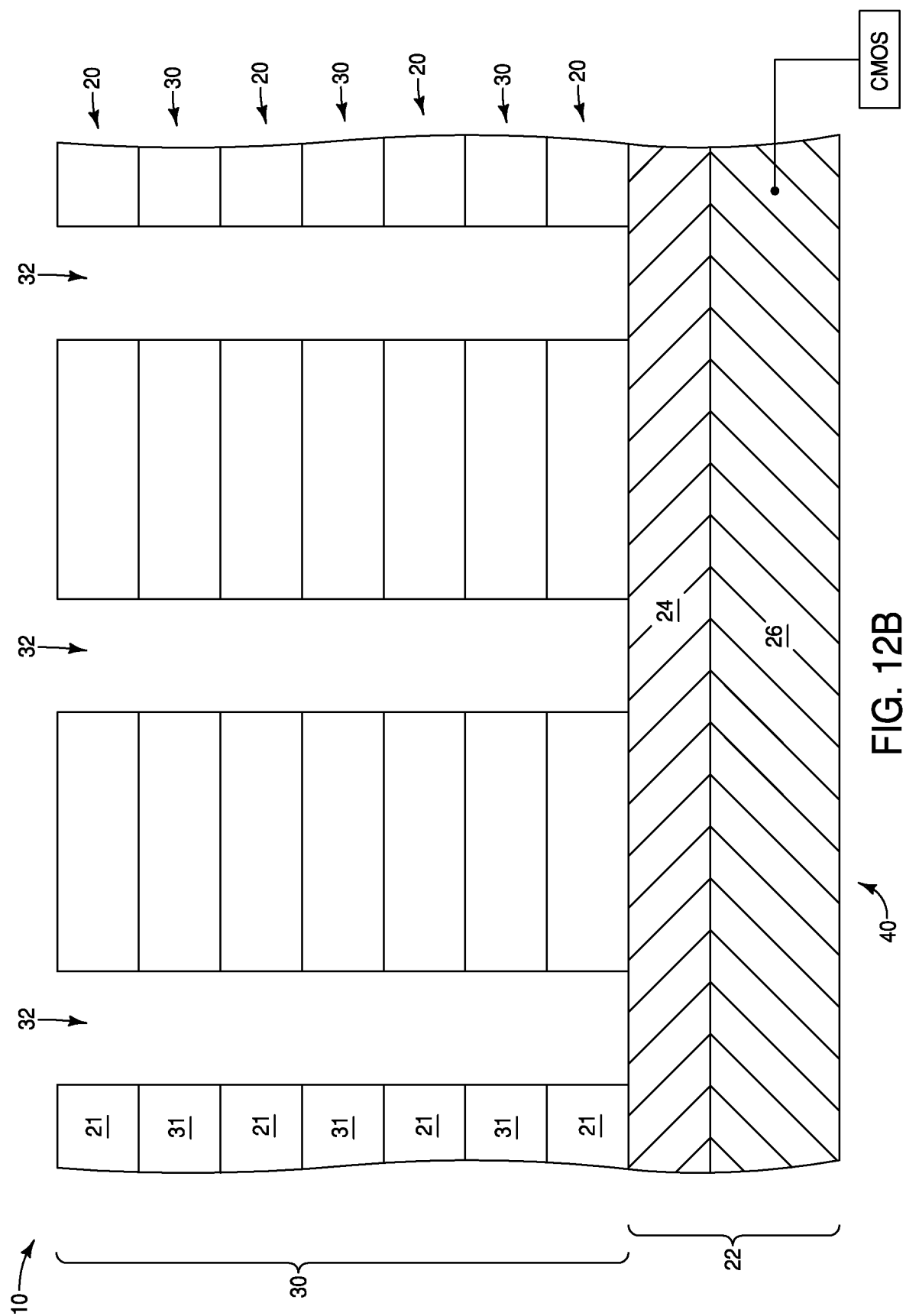
Figure 12C:
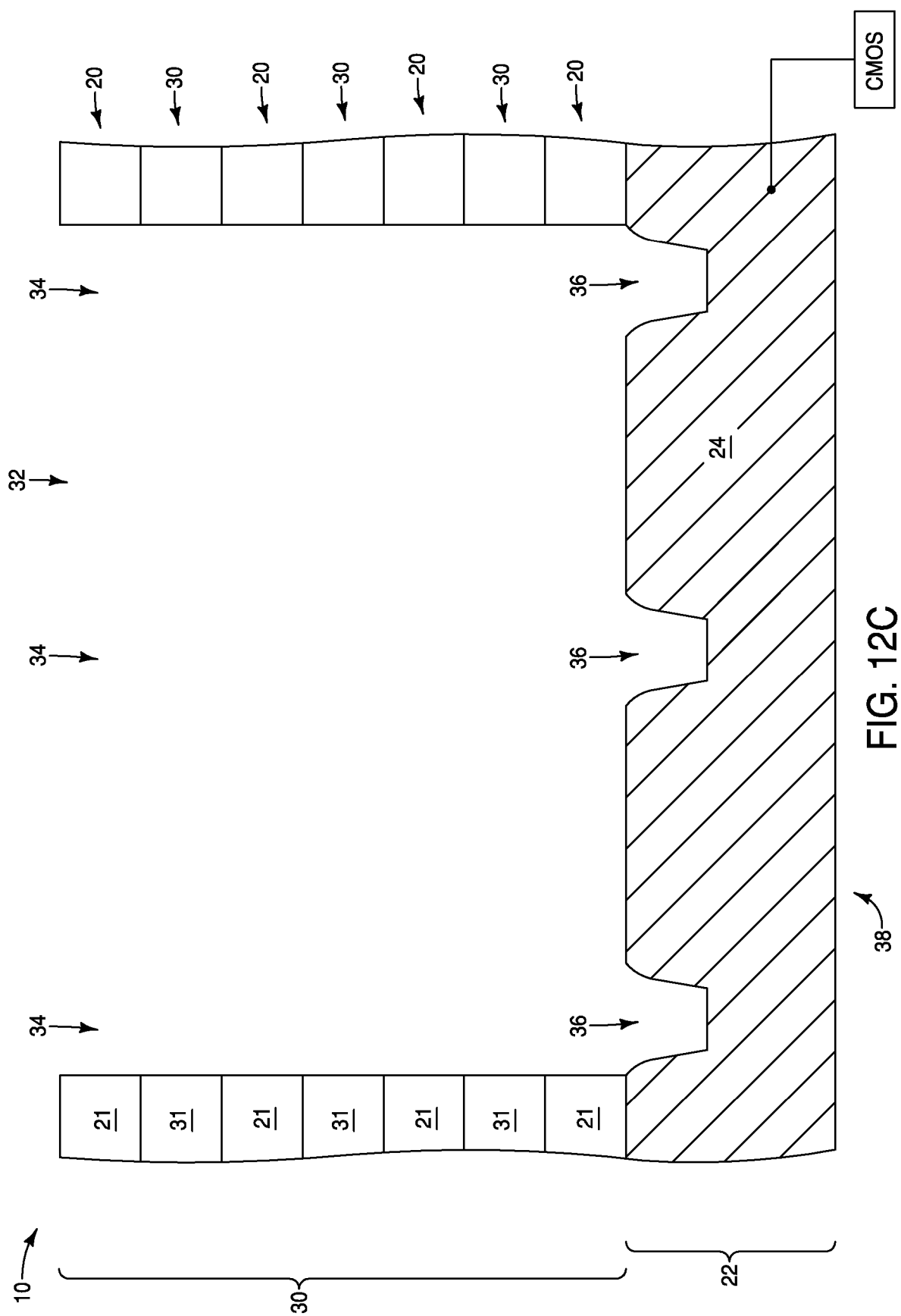

Referring to FIGS. 12-12C, the slits 32 are formed through the stack 30 to the conductive structure 22. The slits join to one another at the intersect regions 34 described above with reference to FIGS. 8-8C, and cavities 36 may form in locations of the conductive structure 22 under such intersect regions for the reasons discussed above with reference to FIGS. 8-8C. The construction of FIGS. 12-12C has the first portion 38 of the conductive structure 22 under the intersect regions 34; and accordingly the cavities 36 extend only into the semiconductor material 24 and do not expose the underlying metal-containing material 26. Notably, only the first portion 38 of the conductive structure 22 is under the intersect regions 34, and the second portion 40 of the conductive structure 22 (i.e., the portion of the conductive structure having the relatively thin semiconductor material 24 over the metal-containing material 26) is not under the intersect regions 34.

The cavities 36 may have uniform dimensions relative to one another, or may be of substantially different dimensions relative to one another. In some embodiments, at least one of the cavities 36 will have a depth D which is deeper than the thickness $T_2$ of the semiconductor material 24 across the second portion 40 of the conductive material 22 (e.g., may have a depth within a range of from at least about 250 Å to about 2500 Å). In some embodiments, one or more of the cavities 36 may have a cross-sectional width (e.g., a width W along the cross-section of FIG. 12A) within a range of from about 100 nanometers (nm) to about 400 nm.

Figure 13:
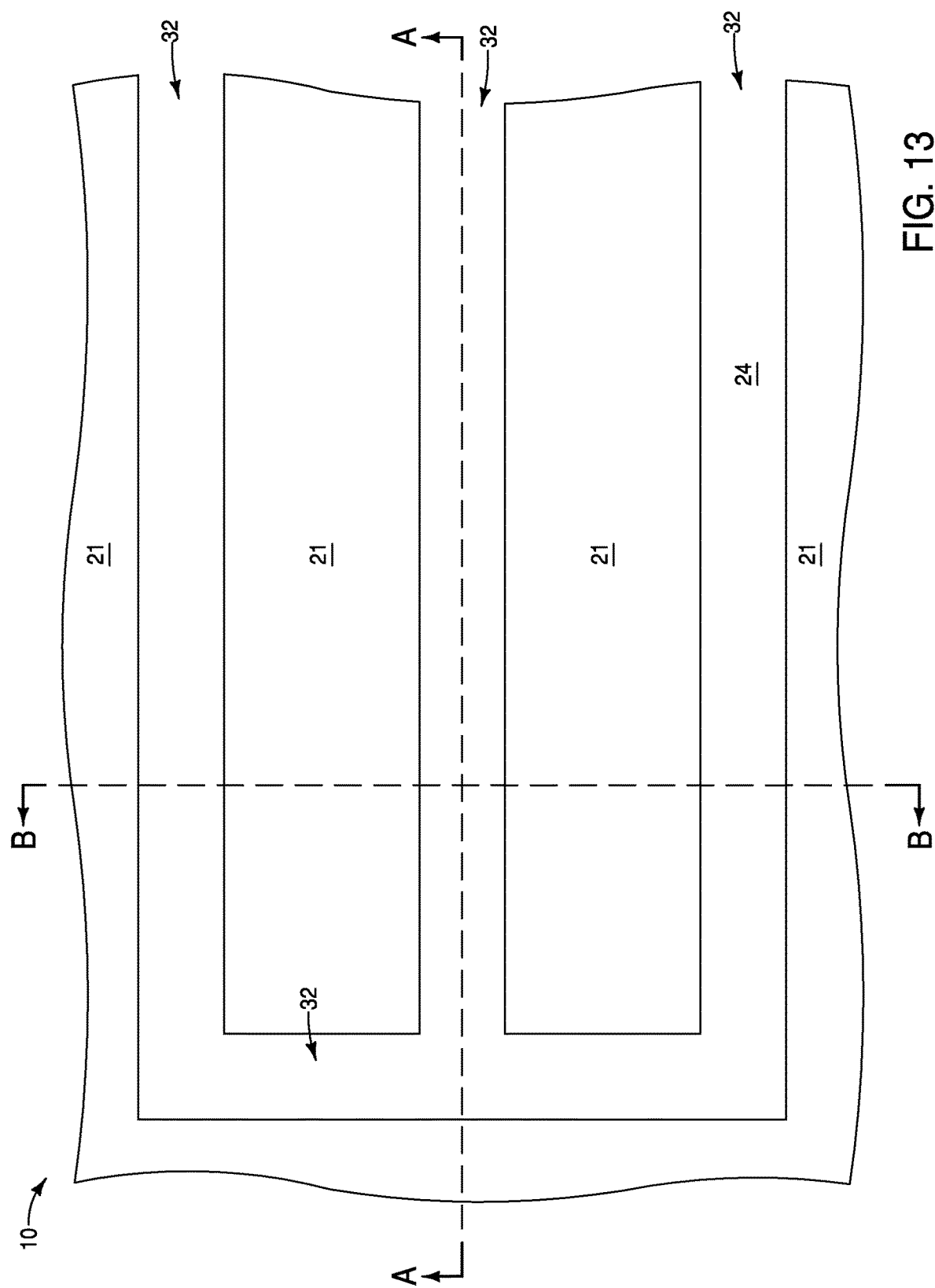
Figure 13A:
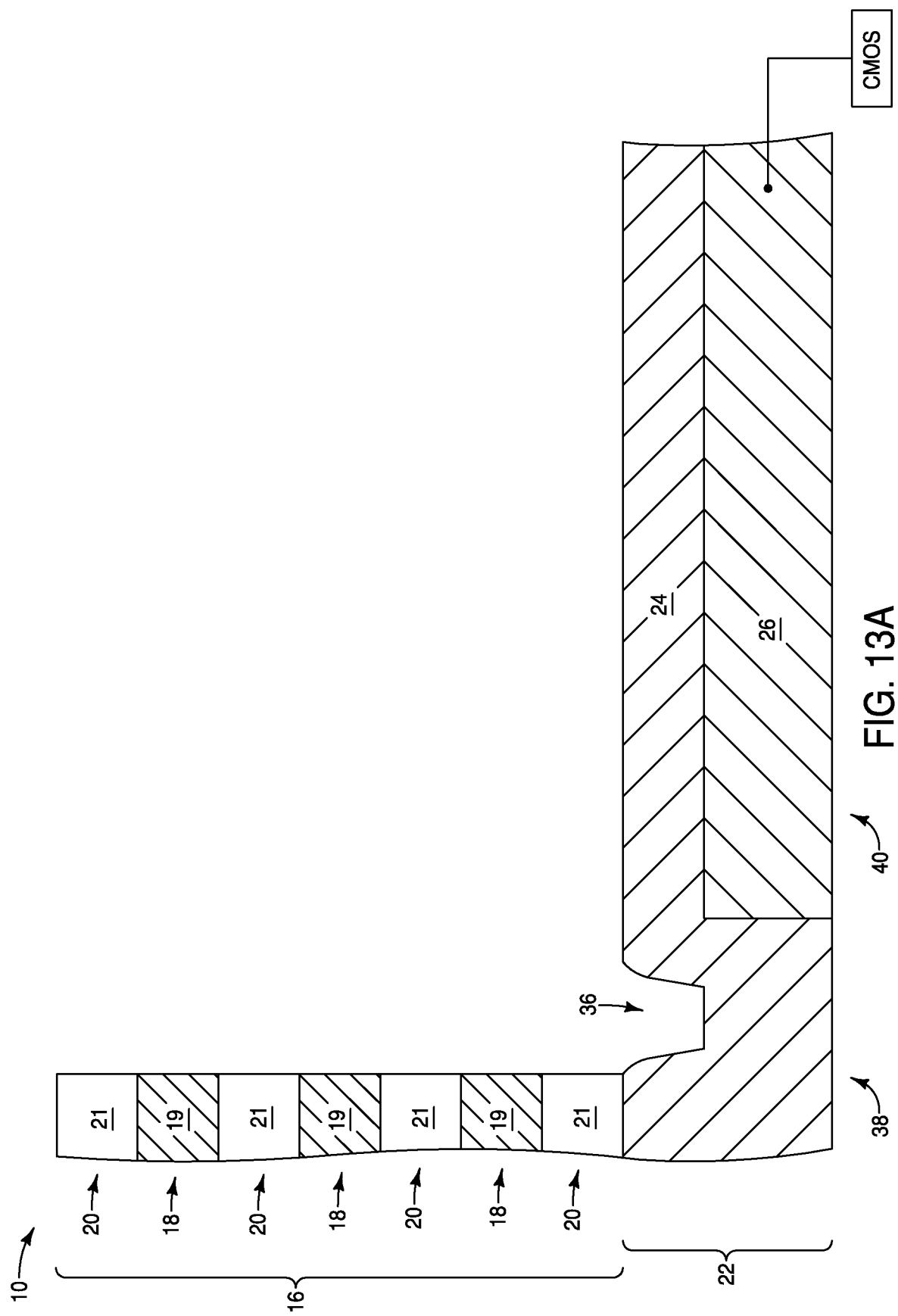

Referring to FIGS. 13-13B, the sacrificial material 30 (FIGS. 12-12C) is replaced with the conductive material 19 utilizing methodologies of the type described above with reference to FIGS. 9-9B. However, since the metal-containing material 26 is not exposed in the construction of FIGS. 13-13B, the problematic galvanic reaction of FIGS. 9-9B is avoided.

Figure 14:
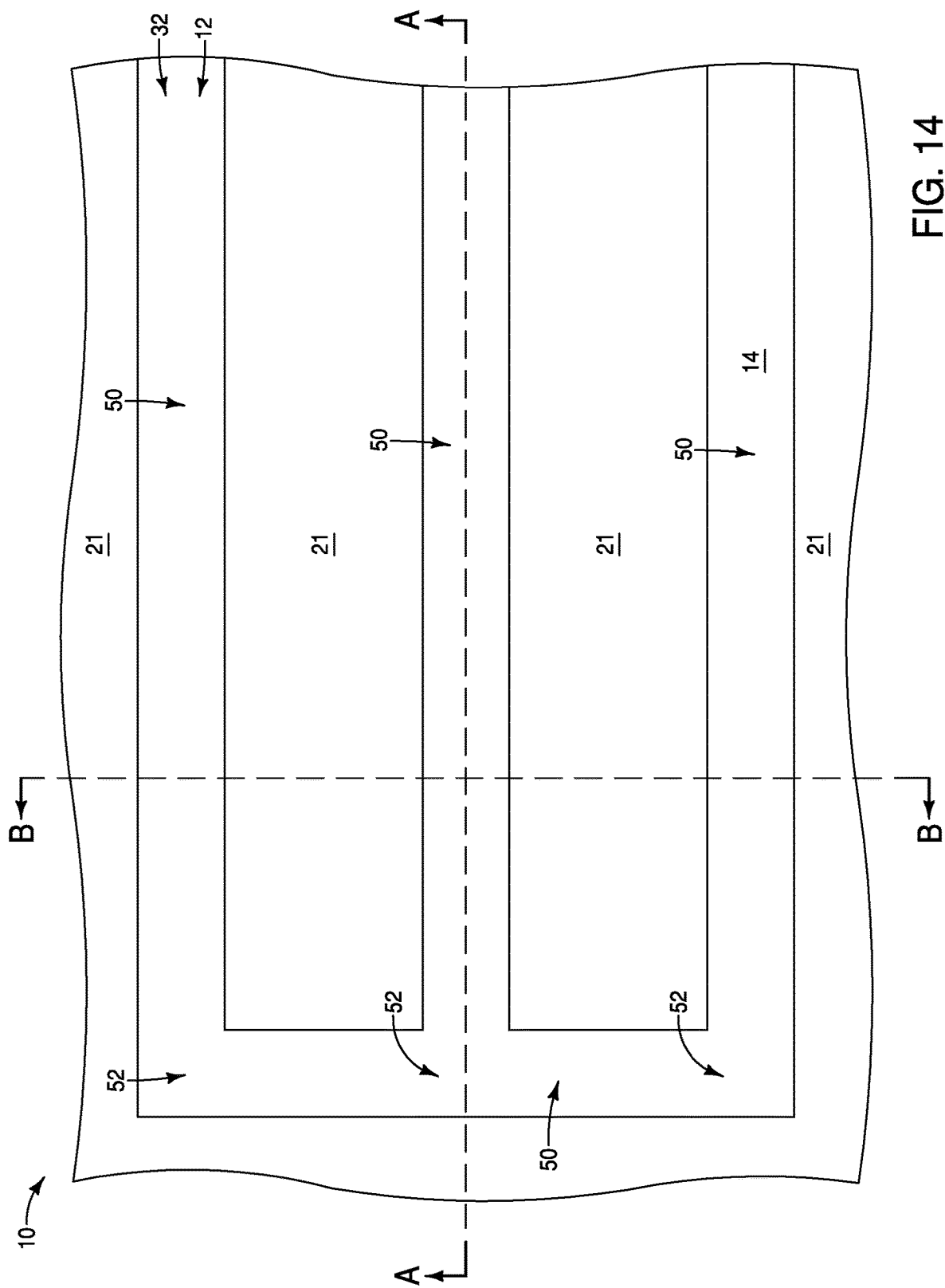

Referring to FIGS. 14-14B, the insulative material 14 is formed within the slits 32 to thereby form the partition 12.

In some embodiments, at least some of the conductive levels 18 may correspond to wordlines levels, and accordingly at least some of the conductive material 19 may correspond to a wordline material of a NAND assembly. The partition 12 may divide such NAND assembly into sub-blocks of the type described above with reference to FIGS. 5-5B.

The partition 12 of FIGS. 14-14B directly contacts a top surface 25 of the conductive structure 24. Such top surface comprises the semiconductor material 24; and in some embodiments may comprise, consist essentially of or consist of conductively-doped silicon (e.g., n-type doped polysilicon).

Figure 14A:
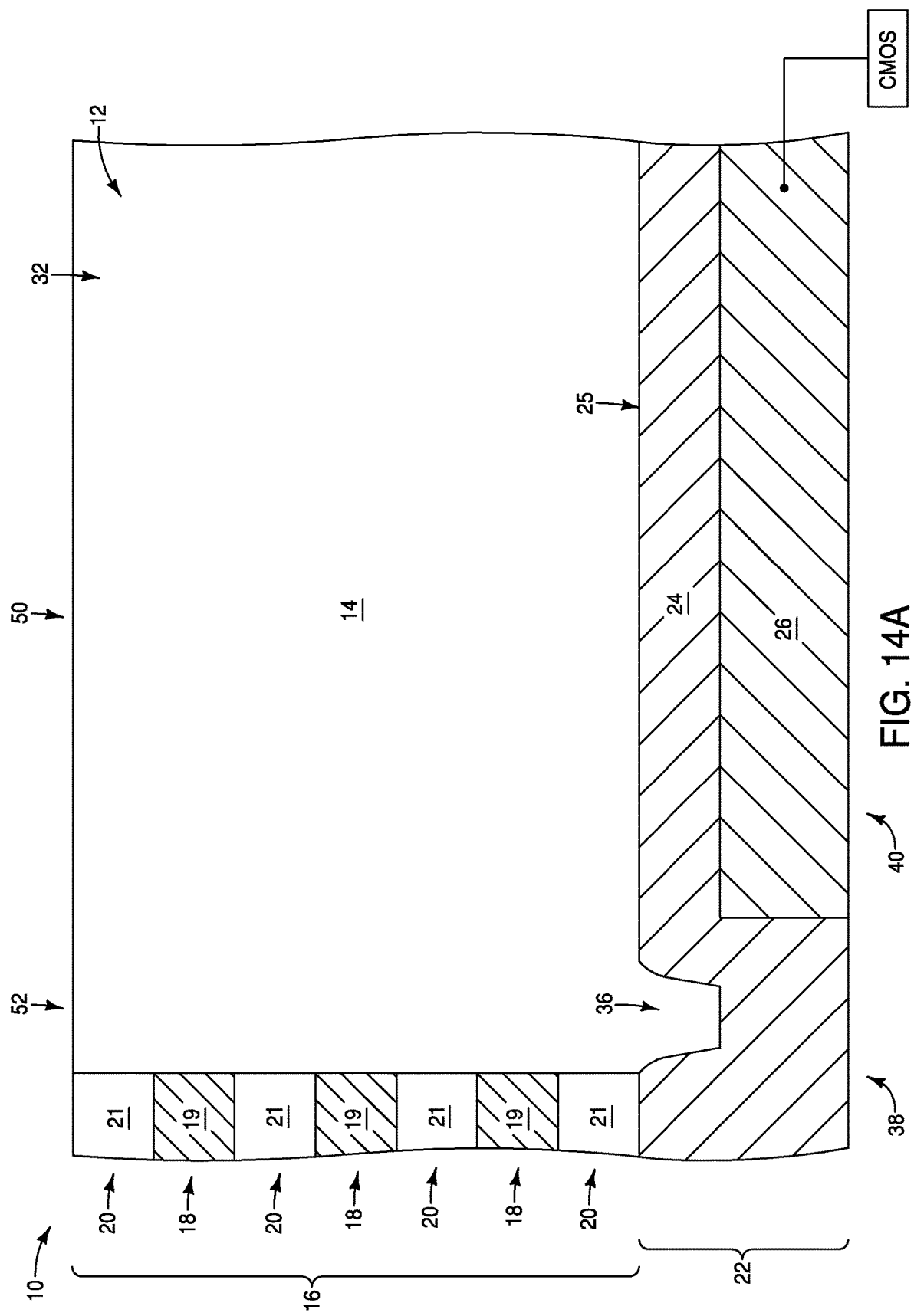

In some embodiments, the partition 12 may be considered to comprise wall regions 50, and to comprise corner regions 52 where two or more wall regions meet. The first portion 38 of the conductive structure 22 is directly under the corner regions 52, and the second portion 40 of the conductive structure 22 is directly under the wall regions 50. The second portion 40 of the conductive structure 22 does not extend to under the corner regions 52. In the shown embodiment, a cavity 36 is also under a corner region 52 of the partition 12, as illustrated in FIG. 14A.

The entirety of stack 16 of FIGS. 5-5B is shown starting from the stack 29 of FIGS. 11-11B. In some applications, only a portion of the stack 16 will start from the stack 29. For instance, the lower conductive level(s) of the stack may correspond to SGS levels comprising different conductive material than that of the of the wordline levels (i.e., the upper conductive levels). In such embodiments, the conductive material of the lower level(s) may be provided at a processing stage prior to that of FIGS. 11-11B, and only the conductive material of the wordline levels will be replaced utilizing the gate replacement methodologies described with reference to FIGS. 13-13B.

Figure 15:
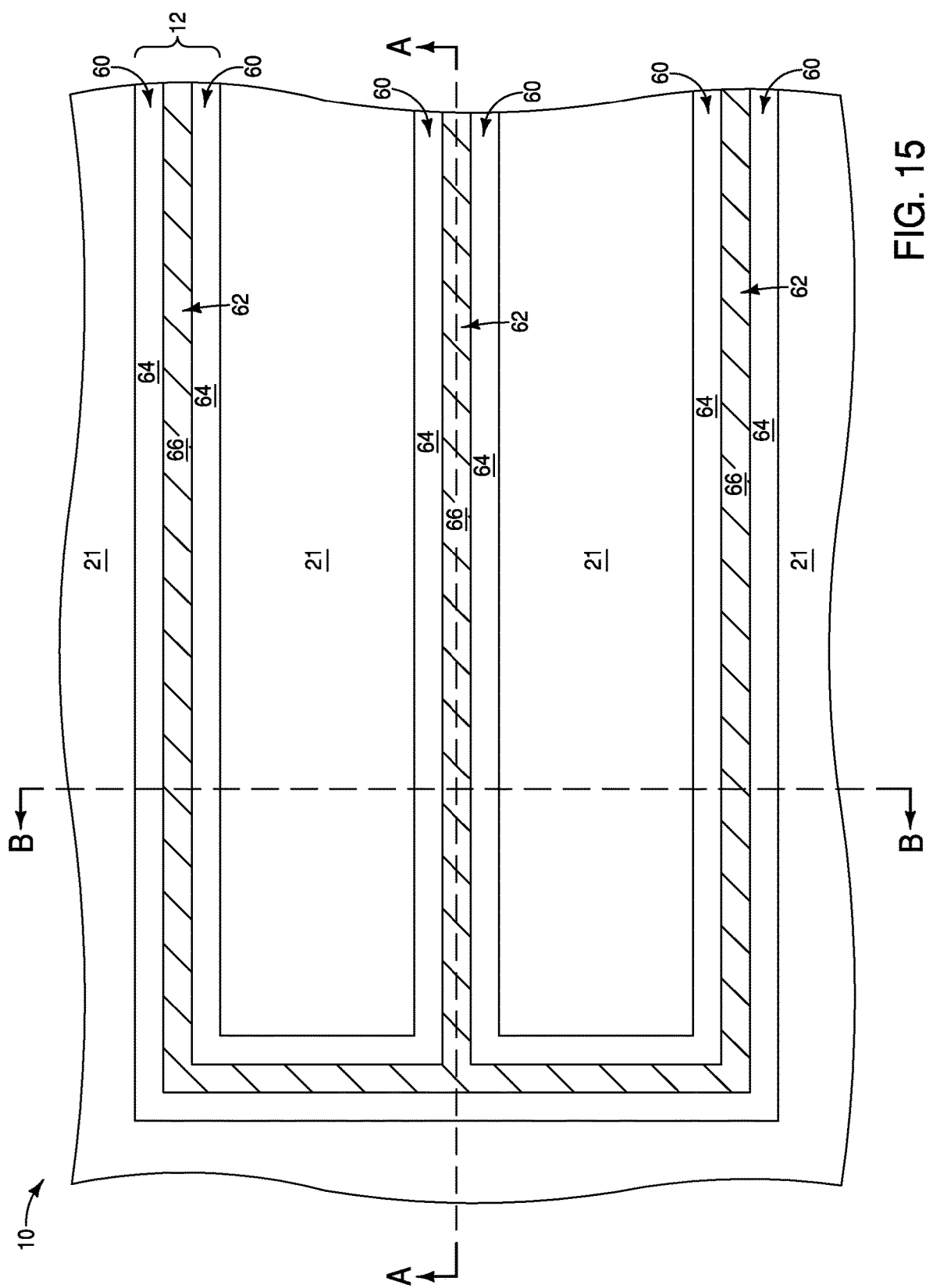
FIG. 15 is a diagrammatic top view of a region of an integrated assembly illustrating another example architecture.
Figure 15A:
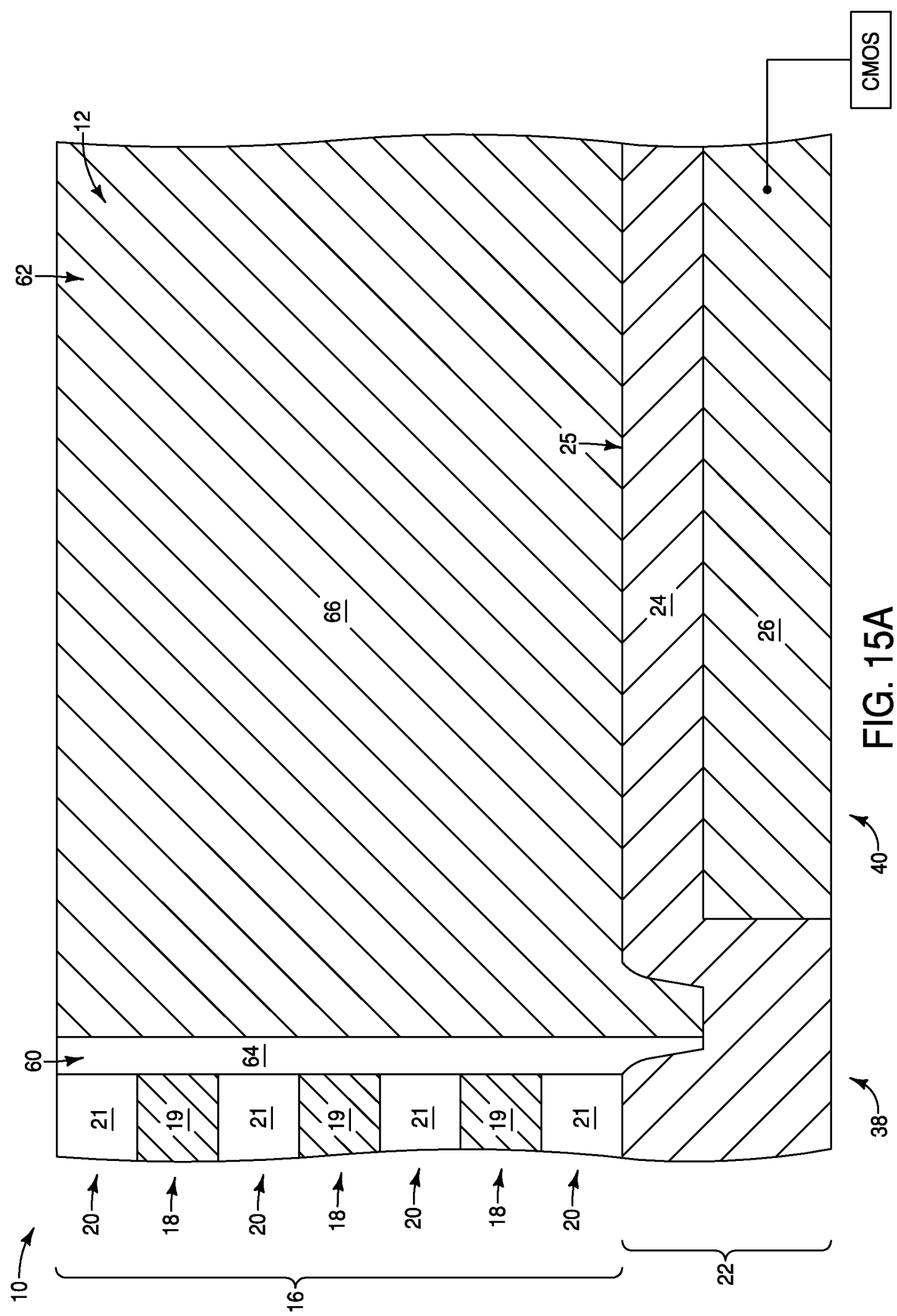
FIGS. 15A and 15B are diagrammatic cross-sectional side views along the lines A-A and 13-B, respectively, of FIG. 15.
Figure 15B:
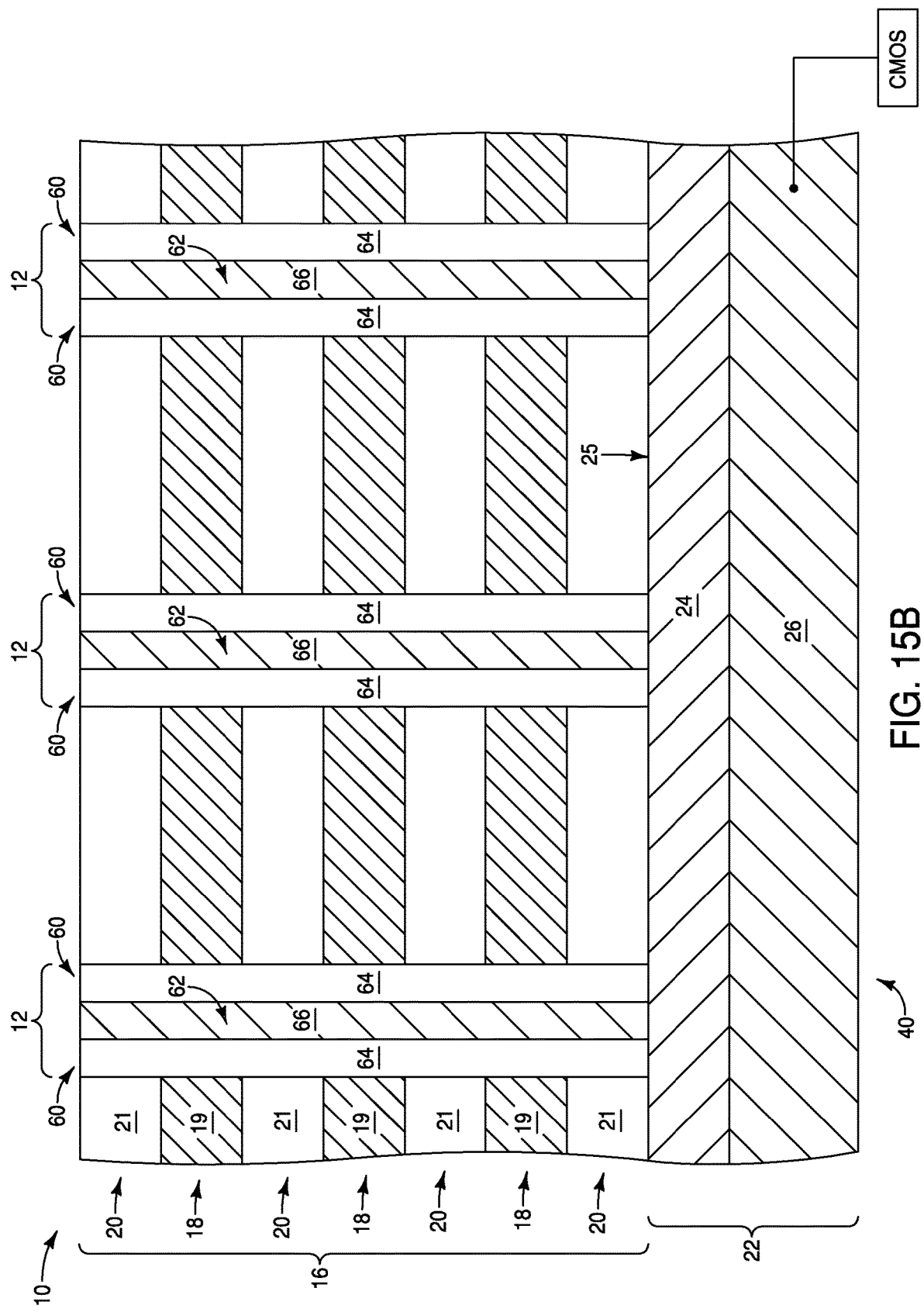

In the embodiment of FIGS. 14-14B, the partition 12 only comprises insulative material 14. In other embodiments, the partition 12 may have other configurations. For instance, FIGS. 15-15B shown an embodiment similar to that of FIGS. 14-14B, but in which the partition 12 comprises insulative panels 60 on opposing sides of a conductive core 62.

The insulative panels 60 comprise insulative material 64. Such material may comprise any suitable composition(s); and in some embodiments may comprise, consist essentially of, or consist of silicon dioxide.

The conductive core 62 comprises conductive material 66. Such conductive material may comprise any suitable electrically conductive composition(s), such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

In the illustrated embodiment, the conductive material 66 directly contacts the upper conductive surface 25 of the conductive structure 22. In other embodiments, the conductive core may or may not directly contact such upper conductive surface 25.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multi-chip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD)), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a conductive structure which includes a semiconductor material over a metal-containing material. A stack of alternating conductive levels and insulative levels is over the conductive structure. A partition extends through the stack and directly contacts a top of the conductive structure. The partition has wall regions, and has corner regions where two or more wall regions meet. The conductive structure includes a first portion which extends directly under the corner regions, and includes a second portion which is directly under the wall regions and is not directly under the corner regions. The first portion has a first thickness of the semiconductor material and the second portion has a second thickness of the semiconductor material. The first thickness is greater than the second thickness.

Some embodiments include an integrated assembly having a conductive structure which comprises a semiconductor material over a metal-containing material. A NAND assembly is over the conductive structure and comprises a stack of wordline levels. A partition extends through the stack. The partition comprises wall regions, and comprises corner regions where two or more wall regions meet. The partition divides the NAND assembly into sub-blocks. The conductive structure comprises a first portion which extends to directly under the corner regions, and comprises a second portion which is directly under the wall regions and is not directly under the corner regions. The first portion comprises a thicker region of the semiconductor material than the second portion.

Some embodiments include a method of forming an integrated assembly. A construction is formed to comprise a conductive structure, and to comprise a stack of alternating first and second levels over the conductive structure. The conductive structure comprises a semiconductor material over a metal-containing material. The conductive structure comprises a first portion and a second portion. The first portion comprises a thicker region of the semiconductor material than the second portion. The first levels comprise a first composition and the second levels comprise a second composition. The second composition is different than the first composition. Slits are formed to extend through the stack to the conductive structure. The slits join to one another at intersect regions. The intersect regions are over the first portion of the conductive structure and are not over the second portion of the conductive structure. After the slits are formed, the first composition is replaced with conductive material. Insulative material is formed within the slits.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. An integrated assembly, comprising:
    a conductive structure comprising a semiconductor material over a metal-containing material;
    an assembly over the conductive structure and comprising a stack of wordline levels;
    a partition extending through the stack; the partition comprising wall regions, and comprising corner regions where two or more wall regions meet; the partition dividing the assembly into sub-blocks; and
    the conductive structure comprising a first portion which extends to directly under the corner regions, and comprising a second portion which is directly under the wall regions and is not directly under the corner regions;
    the first portion comprising a thicker region of the semiconductor material than the second portion.

2. The integrated assembly of claim 1 wherein the partition directly contacts a top of the conductive structure.

3. The integrated assembly of claim 1 wherein the conductive structure has an overall thickness; wherein the semiconductor material of the first portion comprises greater than about half of said overall thickness; and wherein the semiconductor material of the second portion comprises less than or equal to about half of said overall thickness.

4. The integrated assembly of claim 1 comprising a CMOS under the conductive structure and electrically coupled with the conductive structure.

5. The integrated assembly of claim 1 wherein the conductive structure is a source structure coupled with the assembly.

6. The integrated assembly of claim 1 wherein the first portion of the conductive structure only comprises the semiconductor material.

7. The integrated assembly of claim 1 wherein the semiconductor material comprises conductively-doped silicon.

8. The integrated assembly of claim 1 wherein the partition only comprises insulative material.

9. The integrated assembly of claim 1 wherein the partition consists of silicon dioxide.

10. The integrated assembly of claim 1 wherein the partition comprises insulative panels on opposing sides of a conductive core.

11. The integrated assembly of claim 1 comprising cavities extending into the first portion; at least one of the cavities has a depth that is deeper than a thickness of the second thickness.

12. The integrated assembly of claim 1 wherein the semiconductor material is directly against the metal-containing material.

* * * * *